US010910491B2

(12) United States Patent
Lin et al.

(10) Patent No.: US 10,910,491 B2
(45) Date of Patent: *Feb. 2, 2021

(54) SEMICONDUCTOR DEVICE HAVING REDUCED CAPACITANCE BETWEEN SOURCE AND DRAIN PADS

(71) Applicant: DELTA ELECTRONICS, INC., Taoyuan (TW)

(72) Inventors: Li-Fan Lin, Taoyuan (TW); Chun-Chieh Yang, Taoyuan (TW); Ying-Chen Liu, Taoyuan (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/550,293

(22) Filed: Aug. 26, 2019

(65) Prior Publication Data

US 2019/0386128 A1 Dec. 19, 2019

Related U.S. Application Data

(63) Continuation-in-part of application No. 15/678,102, filed on Aug. 15, 2017, which is a (Continued)

(30) Foreign Application Priority Data

Sep. 10, 2013 (TW) .............................. 102132512 A
Feb. 27, 2014 (TW) .............................. 103106659 A
Apr. 21, 2014 (TW) .............................. 103114340 A

(51) Int. Cl.
*H01L 29/778* (2006.01)
*H01L 29/20* (2006.01)
(Continued)

(52) U.S. Cl.
CPC ...... *H01L 29/7787* (2013.01); *H01L 23/3171* (2013.01); *H01L 23/49537* (2013.01);
(Continued)

(58) Field of Classification Search
CPC ............. H01L 27/0883; H01L 27/0605; H01L 23/49541; H01L 23/49562; H01L 23/49575; H01L 29/20; H01L 29/404
(Continued)

(56) References Cited

U.S. PATENT DOCUMENTS 5,767,546 A 6/1998 Williams et al.
7,072,161 B2 7/2006 Chen
(Continued)

FOREIGN PATENT DOCUMENTS

CN 1321340 A 11/2001
CN 1973377 A 5/2007
(Continued)

*Primary Examiner* — Matthew E. Gordon
(74) *Attorney, Agent, or Firm* — CKC & Partners Co., LLC

(57) ABSTRACT

A semiconductor device includes an active layer having an active region, a source electrode, a drain electrode, a gate electrode, a source metal layer, a drain metal layer, and a source pad. The source metal layer and the drain metal layer are electrically connected to the source electrode and the drain electrode, respectively. An orthogonal projection of the drain metal layer on the active layer each forms a drain metal layer region. The source pad is electrically connected to the source metal layer. An orthogonal projection of the source pad on the active layer forms a source pad region overlapping the drain metal layer. An area of an overlapping region between the source pad region and the drain metal layer region is smaller than or equal to 40% of an area of the drain metal layer region.

13 Claims, 20 Drawing Sheets

Related U.S. Application Data continuation-in-part of application No. 15/297,123, filed on Oct. 18, 2016, now Pat. No. 10,084,076, which is a continuation of application No. 14/496,471, filed on Sep. 25, 2014, now Pat. No. 9,508,843, which is a continuation-in-part of application No. 14/185,322, filed on Feb. 20, 2014, now Pat. No. 8,957,493.

(51) Int. Cl.

| | | |
|---|---|---|
| *H01L 29/417* | (2006.01) | |
| *H01L 29/40* | (2006.01) | |
| *H01L 23/535* | (2006.01) | |
| *H01L 23/31* | (2006.01) | |
| *H01L 23/528* | (2006.01) | |
| *H01L 23/522* | (2006.01) | |
| *H01L 29/423* | (2006.01) | |
| *H01L 23/495* | (2006.01) | |
| *H01L 23/00* | (2006.01) | |
| *H01L 29/205* | (2006.01) | |

(52) U.S. Cl.
CPC .. *H01L 23/49541* (2013.01); *H01L 23/49562* (2013.01); *H01L 23/49575* (2013.01); *H01L 23/528* (2013.01); *H01L 23/5226* (2013.01); *H01L 23/5283* (2013.01); *H01L 23/535* (2013.01); *H01L 24/06* (2013.01); *H01L 29/2003* (2013.01); *H01L 29/205* (2013.01); *H01L 29/402* (2013.01); *H01L 29/41758* (2013.01); *H01L 29/4236* (2013.01); *H01L 29/7786* (2013.01); *H01L 24/48* (2013.01); *H01L 29/42376* (2013.01); *H01L 2224/04042* (2013.01); *H01L 2224/05093* (2013.01); *H01L 2224/0603* (2013.01); *H01L 2224/45014* (2013.01); *H01L 2224/48137* (2013.01); *H01L 2224/48247* (2013.01); *H01L 2224/48257* (2013.01); *H01L 2224/49111* (2013.01); *H01L 2924/1033* (2013.01); *H01L 2924/10344* (2013.01); *H01L 2924/13064* (2013.01)

(58) Field of Classification Search
USPC .................................................. 257/194, 316
See application file for complete search history.

(56) References Cited

U.S. PATENT DOCUMENTS

| | | | |
|---|---|---|---|
| 7,800,131 | B2 | 9/2010 | Miyamoto et al. |
| 7,928,475 | B2 | 4/2011 | Parikh et al. |
| 8,237,196 | B2 | 8/2012 | Saito |
| 8,530,978 | B1 | 9/2013 | Chu et al. |
| 8,691,684 | B2 | 4/2014 | Zhong et al. |
| 9,508,843 | B2 * | 11/2016 | Lin .................... H01L 29/41758 |
| 10,236,236 | B2 * | 3/2019 | Lin ...................... H01L 23/485 |
| 2003/0076639 | A1 | 4/2003 | Chen |
| 2003/0082860 | A1 | 5/2003 | Yoshida |
| 2005/0189562 | A1 | 9/2005 | Kinzer |
| 2007/0007545 | A1 | 1/2007 | Salcedo et al. |
| 2007/0108617 | A1 * | 5/2007 | Heiling ............... H01L 23/4824 257/758 |
| 2007/0205506 | A1 | 9/2007 | Dragon et al. |
| 2008/0272443 | A1 | 11/2008 | Hoshi et al. |
| 2008/0303097 | A1 | 12/2008 | Alter et al. |
| 2009/0108459 | A1 | 4/2009 | Motoyui |
| 2011/0193171 | A1 | 8/2011 | Yamagiwa et al. |
| 2011/0248283 | A1 | 10/2011 | Cao et al. |
| 2013/0062625 | A1 | 3/2013 | Takada et al. |
| 2013/0146946 | A1 * | 6/2013 | Tsurumi .............. H01L 29/4175 257/192 |
| 2013/0161692 | A1 | 6/2013 | Koudymov |
| 2013/0221437 | A1 | 8/2013 | Illegems et al. |
| 2014/0001515 | A1 | 1/2014 | Kudymov et al. |
| 2015/0295573 | A1 | 10/2015 | Suzuki et al. |
| 2015/0340344 | A1 | 11/2015 | Lin et al. |
| 2016/0043643 | A1 | 2/2016 | Ujita et al. |
| 2016/0329890 | A1 | 11/2016 | Ujita et al. |
| 2017/0154839 | A1 | 6/2017 | Lin et al. |

FOREIGN PATENT DOCUMENTS

| | | |
|---|---|---|
| CN | 102544002 A | 7/2012 |
| CN | 103178106 A | 6/2013 |
| TW | 200633211 | 9/2006 |
| TW | 201036156 A | 10/2010 |
| TW | 201338113 A | 9/2013 |
| TW | 201340316 A | 10/2013 |
| TW | 201511267 A | 3/2015 |
| TW | 201533906 A | 9/2015 |

* cited by examiner

SEMICONDUCTOR DEVICE HAVING REDUCED CAPACITANCE BETWEEN SOURCE AND DRAIN PADS

CROSS-REFERENCE TO RELATED APPLICATIONS

The present application is a continuation-in-part application of U.S. application Ser. No. 15/678,102, filed Aug. 15, 2017, which is a continuation-in-part application of U.S. application Ser. No. 15/297,123, filed Oct. 18, 2016, now U.S. Pat. No. 10,084,076, issued on Sep. 25, 2018, which is a continuation application of U.S. application Ser. No. 14/496,471, filed Sep. 25, 2014, now U.S. Pat. No. 9,508,843, issued on Nov. 29, 2016, which claims priority to Taiwan Application Serial Number 103106659, filed Feb. 27, 2014 and Taiwan Application Serial Number 103114340, filed Apr. 21, 2014, which are herein incorporated by reference in their entireties. U.S. application Ser. No. 14/496,471 is a continuation-in-part application of U.S. application Ser. No. 14/185,322, filed Feb. 20, 2014, now U.S. Pat. No. 8,957,493, issued on Feb. 17, 2015, which claims priority to Taiwan Application Serial Number 102132512, filed Sep. 10, 2013, which are herein incorporated by reference in their entireties.

BACKGROUND

Field of Disclosure

The present disclosure relates to a semiconductor device.

Description of Related Art

In order to shrink the area of a semiconductor device, the drain pad or the source pad of the semiconductor device may be fabricated to be overlapped with the source electrodes or the drain electrodes. However, the overlapping between source and drain may cause high stress which may damage the semiconductor device. Furthermore, if the length of the pad is too long, the resistance may increase, and the current uniformity may become worse. Thus, there is a need to provide a semiconductor device that may reduce the resistance and improve the uniformity of the current.

SUMMARY

A semiconductor device includes an active layer, a source electrode, a drain electrode, a gate electrode, a source metal layer, a drain metal layer, and a source pad. The active layer has an active region. The source electrode, the drain electrode, and the gate electrode are disposed on the active region of the active layer and extend along a first direction. The source metal layer is disposed on the active region and is electrically connected to the source electrode. The drain metal layer is disposed on the active region and electrically connected to the drain electrode, and an orthogonal projection of the drain metal layer on the active layer forms a drain metal layer region. The source pad is disposed on the active region, and the source pad is electrically connected to the source metal layer. An orthogonal projection of the source pad on the active layer forms a source pad region that overlaps the drain metal layer region, and an area of an overlapping region between the source pad region and the drain metal layer region is smaller than or equal to 40% of an area of the drain metal layer region.

In some embodiments, an orthogonal projection of the source metal layer on the active layer forms a source metal layer region. The semiconductor device further includes a drain pad disposed on the active region, and the drain pad is electrically connected to the drain metal layer. An orthogonal projection of the drain pad on the active layer forms a drain pad region that overlaps the source metal layer region, and an area of an overlapping region between the drain pad region and the source metal layer region is smaller than or equal to 40% of an area of the source metal layer region.

In some embodiments, the source electrode includes a bottom electrode portion and a top electrode portion. The electrode portion of the source electrode is disposed between the metal layer portion of the source electrode and the active layer.

In some embodiments, the drain electrode includes a bottom electrode portion and a top electrode portion. The electrode portion of the drain electrode is disposed between the metal layer portion of the drain electrode and the active layer.

In some embodiments, the source metal layer further includes a second branch portion extending along the first direction.

In some embodiments, the source pad further includes a body portion and a first branch portion. The body portion extends along the first direction and the first branch portion extends along the second direction.

In some embodiments, the source metal layer includes a first branch portion extending along a second direction different from the first direction and a second branch portion extending along the first direction.

In some embodiments, the source pad further includes a second branch portion extending along the first direction and electrically connected to the second branch portion of the source metal layer.

In some embodiments, the drain metal layer further includes a second branch portion extending along the first direction.

In some embodiments, the drain pad further includes a body portion extending along the first direction and a first branch portions extending along the second direction.

In some embodiments, the drain metal layer includes a first branch portion extending along the second direction and a second branch portion extending along the first direction.

In some embodiments, the drain pad further includes a second branch portion extending along the first direction and electrically connected to the second branch portion of the drain metal layer.

A semiconductor device includes an active layer, a plurality of source electrodes, a plurality of drain electrodes, a plurality of gate electrodes, a source metal layer, a drain metal layer, and a source pad. The active layer has a plurality of active regions spaced apart from each other. The source electrodes, the drain electrodes, and the gate electrodes are respectively disposed on the active regions of the active layer, and the gate electrodes are electrically connected with each other. The source metal layer is electrically connected to the source electrodes. The drain metal layer is electrically connected to the drain electrodes, and a projection of the drain metal layer on the active layer forms a drain metal layer region. The source pad is disposed on the active region, and the source pad is electrically connected to the source metal layer. An orthogonal projection of the source pad on the active layer forms a source pad region that overlaps the drain metal layer region, and an area of an overlapping region between the source pad region and the drain metal layer region is smaller than or equal to 40% of an area of the drain metal layer region.

In some embodiments, a projection of the source metal layer on the active layer forms a source metal layer region. The semiconductor device further includes a drain pad disposed on the active region, and the drain pad is electrically connected to the drain metal layer. An orthogonal projection of the drain pad on the active layer forms a drain pad region that overlaps the source metal layer region, and an area of an overlapping region between the drain pad region and the source metal layer region is smaller than or equal to 40% of an area of the source metal layer region.

In some embodiments, the semiconductor device further includes a gate bus electrically connected to the gate electrodes.

In some embodiments, the gate bus extends from the gate electrodes and is laterally arranged in a layer stacked between the active layer and the source metal layer or the drain metal layer.

In some embodiments, the gate electrodes are disposed between the gate bus and the active layer.

A semiconductor device includes an active layer, a first source electrode, a first drain electrode, a first gate electrode, a second source electrode, a second drain electrode, a second gate electrode, a first source metal layer, a first drain metal layer, a second drain metal layer, and a source pad. The active layer has a first active region and a second active region spaced apart from each other. The first source electrode, the first drain electrode, and the first gate electrode are disposed on the first active region of the active layer. The second source electrode, the second drain electrode, and the second gate electrode are disposed on the second active region of the active layer. The first source metal layer is electrically connected to the first source electrode. The first drain metal layer is electrically connected to the first drain electrode. The second drain metal layer is electrically connected to the second drain electrode and the first source metal layer, and a projection of the second drain metal layer on the second active layer forms a drain metal layer region. The source pad is disposed on the active region, and the source pad is electrically connected to the first source metal layer. An orthogonal projection of the source pad on the active layer forms a source pad region that overlaps the drain metal layer region, and an area of an overlapping region between the source pad region and the drain metal layer region is smaller than or equal to 40% of an area of the drain metal layer region.

In some embodiments, a projection of the first source metal layer on the first active layer forms a source metal layer region. The semiconductor device further includes a drain pad disposed on the active region, and the drain pad is electrically connected to the second drain metal layer. An orthogonal projection of the drain pad on the active layer forms a drain pad region that overlaps the source metal layer region, and an area of an overlapping region between the drain pad region and the source metal layer region is smaller than or equal to 40% of an area of the source metal layer region.

In some embodiments, the semiconductor device includes a second source metal layer electrically connected to the second source electrode.

DETAILED DESCRIPTION

Figure 1:
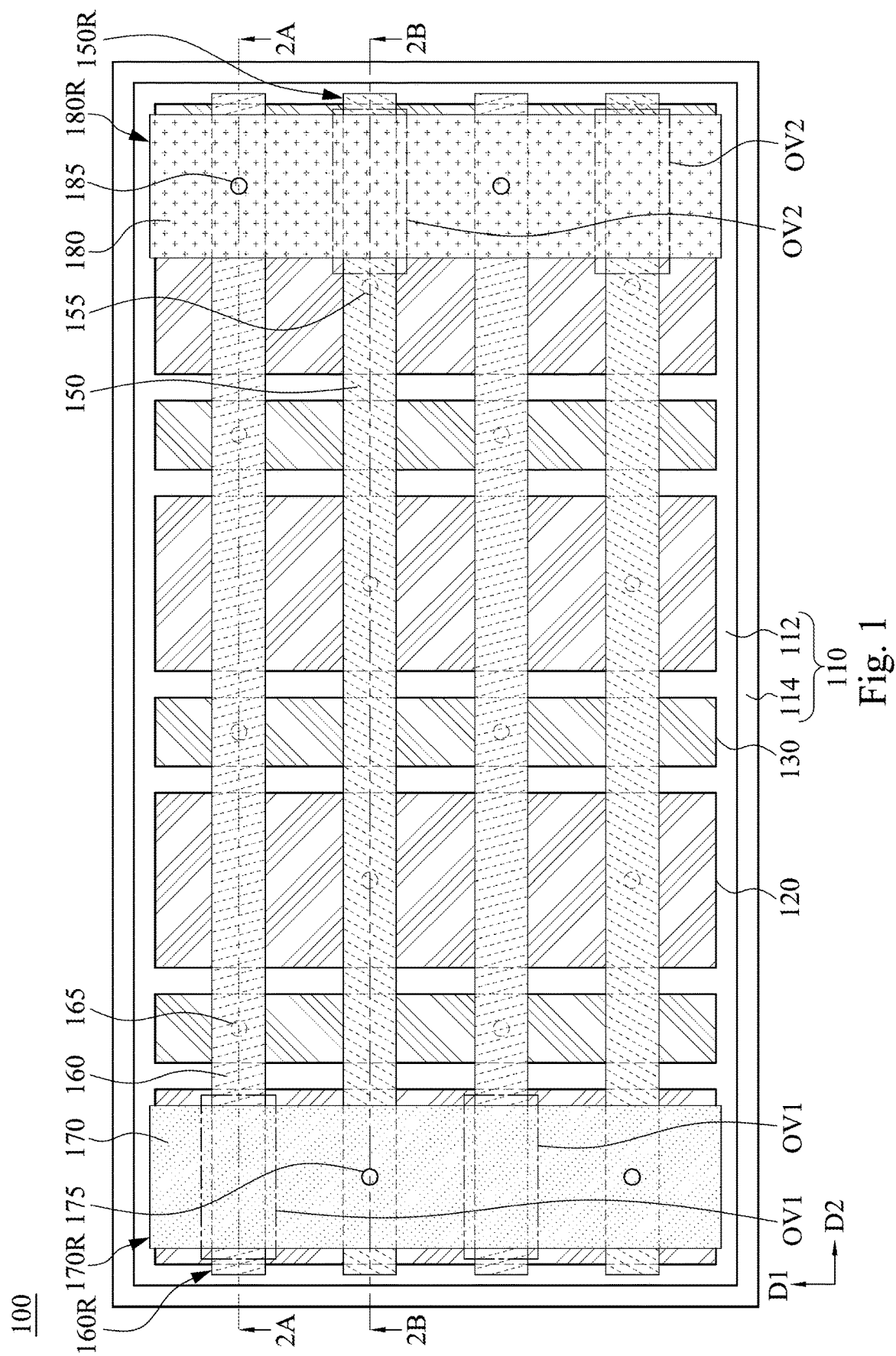
FIG. 1 is a top view of a semiconductor device according to some embodiments of the present disclosure.

Reference will now be made in detail to the present embodiments of the invention, examples of which are illustrated in the accompanying drawings. Wherever possible, the same reference numbers are used in the drawings and the description to refer to the same or like parts.

Figure 2A:
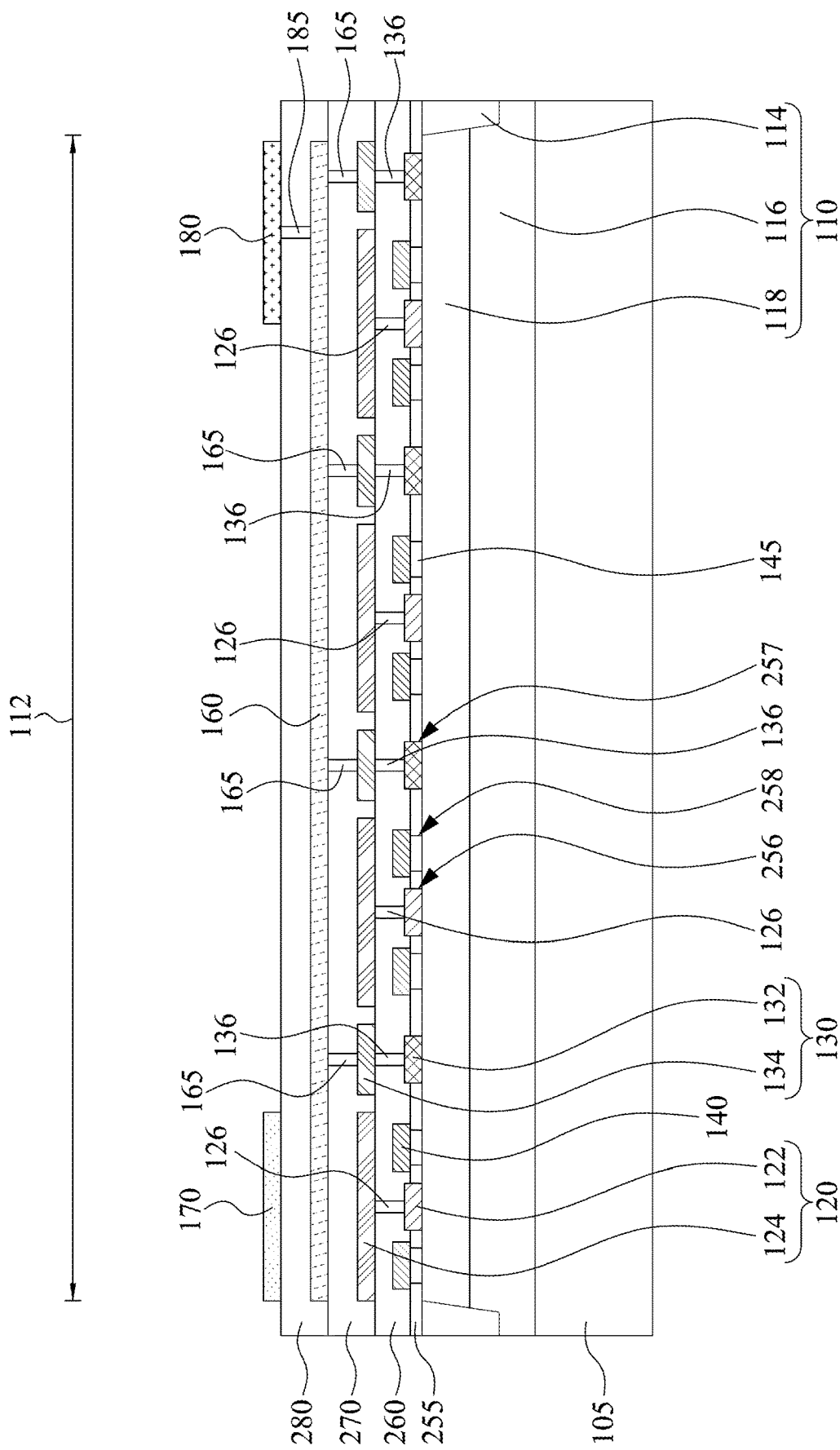
FIG. 2A is a cross-sectional view along line 2A-2A of FIG. 1.
Figure 2B:
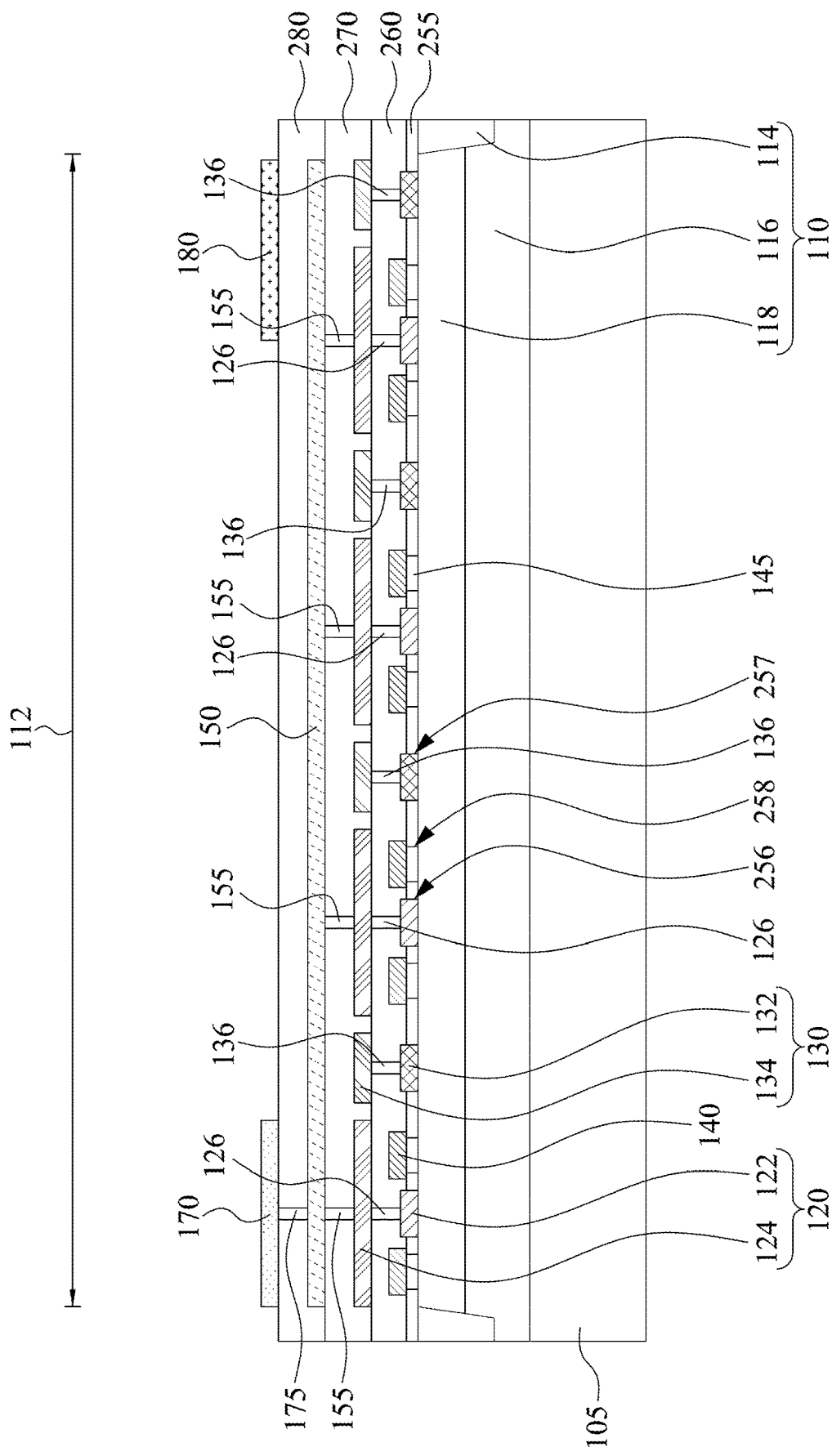
FIG. 2B is a cross-sectional view along line 2B-2B of FIG. 1.

FIG. 1 is a top view of a semiconductor device 100 according to some embodiments of the present disclosure, FIG. 2A is a cross-sectional view along line 2A-2A of FIG. 1, and FIG. 2B is a cross-sectional view along line 2B-2B of FIG. 1. Reference is made to FIGS. 1, 2A, and 2B. The semiconductor device 100 includes an active layer 110, source electrodes 120, drain electrodes 130, gate electrodes 140, source metal layers 150, drain metal layers 160, a source pad 170, and a drain pad 180. The active layer 110 has an active region 112. The source electrodes 120, the drain electrodes 130, the gate electrodes 140, the source metal layers 150, and the drain metal layers 160 are disposed on the active region 112 of the active layer 110.

The source metal layers 150 and the drain metal layers 160 are alternately arranged along a first direction D1 and extend along the second direction D2 different from the first direction D1. For example, the first direction D1 is substantially perpendicular to the second direction D2 as shown in FIG. 1. The source metal layers 150 are spaced from each other, and the drain metal layers 160 are spaced from each other. The term "substantially" as used herein may be applied to modify any quantitative representation which could permissibly vary without resulting in a change in the basic function to which it is related.

The source pad 170 ad the drain pad 180 extend along the first direction D1. That is, the source pad 170 and the drain pad 180 are substantially parallel to each other. As illustrated in FIGS. 1 and 2B, the source pad 170 is electrically connected to the source metal layers 150 and the source electrodes 120. The source pad 170 is at least partially disposed on the active region 112 of the active layer 110. For example, a projection of the source pad 170 on the active layer 110 is within the active region 112 or overlaps the active region 112. That is, the source pad 170 overlaps at least a portion of the source electrodes 120, and at least a portion of the gate electrodes 140, and optionally overlaps at least a portion of the drain electrodes 130. As illustrated in FIGS. 1 and 2A, the drain pad 180 is electrically connected to the drain metal layer 160 and the drain electrodes 130. The drain pad 180 is at least partially disposed on the active region 112 of the active layer 110. For example, a projection of the drain pad 180 on the active layer 110 is within the active region 112 or overlaps the active region 112. That is, the drain pad 180 overlaps at least a portion of the drain electrodes 130, at least a portion of the gate electrodes 140, and/or at least a portion of the source electrodes 120.

The semiconductor device 100 further includes a dielectric layer 280. For clarity, the dielectric layer 280 is illustrated in FIGS. 2A and 2B. The dielectric layer 280 covers the source metal layers 150 and the drain metal layers 160. The source pad 170 and the drain pad 180 are disposed on the dielectric layer 280. As illustrated in FIGS. 1 and 2B, the source pad 170 is electrically connected to the source metal layers 150, for example, through vias 175 disposed in the dielectric layer 280. As illustrated in FIGS. 1 and 2A, the drain pad 180 is electrically connected to the drain metal layers 160, for example, through vias 185 disposed in the dielectric layer 280.

Reference is made to FIGS. 2A and 2B. In some embodiments, the active layer 110 includes a channel layer 116 and a barrier layer 118 disposed on the channel layer 116. In some embodiments, the channel layer 116 can be made of GaN, and the barrier layer 118 can be made of AlGaN. The active layer 110 further includes an insulating region 114 surrounding the active region 112. The insulating region 114 may be formed by implanting ions, such as oxygen, nitrogen, carbon, or the like, into the active layer 112. In some other embodiments, the insulating region 114 is a shallow trench isolation (STI). The active layer 110 may be selectively disposed on a substrate 105. The substrate 105 may be a silicon substrate or a sapphire substrate, but the claimed scope of the present invention is not limited in this respect. In one embodiment, the semiconductor device 100 may further include a buffer layer (not shown) disposed between the active layer 110 and the substrate 105.

Figure 3:
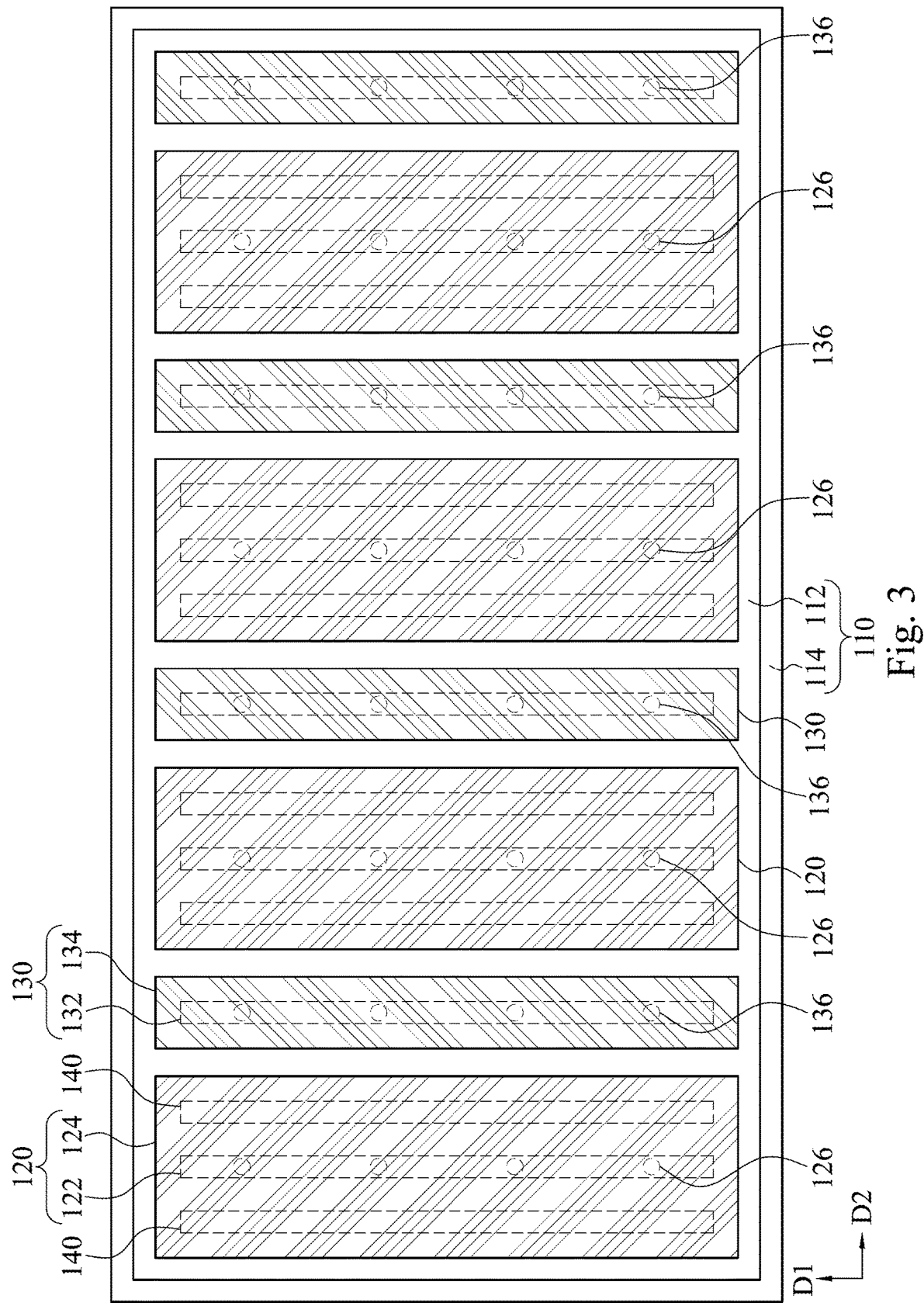
FIG. 3 is a top view of the source electrodes, the drain electrodes, the gate electrodes, and the active layer of the semiconductor device of FIG. 1.

FIG. 3 is a top view of the source electrodes 120, the drain electrodes 130, the gate electrodes 140, and the active layer 110 of the semiconductor device 100 of FIG. 1. Reference is made to FIGS. 2A, 2B, and 3. In the present embodiment, the source electrodes 120 include bottom source electrode portions 122 and top source electrode portions 124, and the drain electrodes 130 include bottom drain electrode portions 132 and top drain electrode portions 134. In some other embodiments, the top source electrode portion 124 and the top drain electrode portion 134 can be omitted. The semiconductor device 100 further includes p-type layers 145, dielectric layers 255 and 260. For clarity, the dielectric layers 255 and 260 are illustrated in FIGS. 2A and 2B. The p-type layers 145 are disposed between the gate electrodes 140 and the active layer 110. Therefore, the semiconductor device 100 is an enhancement mode transistor. In some other embodiments, however, the semiconductor device 100 can be a depletion mode transistor, and the present disclosure is not limited in this respect.

The dielectric layer 255 is disposed on the active layer 110 and has a plurality of openings 256, 257, and 258. The bottom source electrode portions 122 are disposed in the openings 256, the bottom drain electrode portions 132 are disposed in the openings 257, and the p-type layers 145 are disposed in the openings 258. The dielectric layer 260 is disposed on the dielectric layer 255 and covers the bottom source electrode portions 122, the bottom drain electrode portions 132, and the gate electrodes 140. In other words, the bottom source electrode portions 122, the bottom drain electrode portions 132, and the gate electrodes 140 are disposed between the dielectric layer 260 and the active layer 110. The top source electrode portions 124 are disposed on the dielectric layer 260 and cover the bottom source electrode portions 122 and the gate electrodes 140, and the top drain electrode portions 134 are disposed on the dielectric layer 260 and cover the bottom drain electrode portions 132. The top source electrode portions 124 and the top drain electrode portions 134 extend along the first direction D1 and alternately arranged along the second direction D2.

Reference is made to FIGS. 1, 2A, and 2B. The semiconductor device 100 further includes a dielectric layer 270. For clarity, the dielectric layer 270 is illustrated in FIGS. 2A and 2B. The dielectric layer 270 covers the top source electrode portions 124 and the top drain electrode portions 134. In other words, the top source electrode portions 124 and the top drain electrode portions 134 are disposed between the dielectric layers 260 and 270, and the source metal layers 150 and the drain metal layers 160 are disposed between the dielectric layers 270 and 280. The source metal layers 150 are disposed on the dielectric layer 270 and are electrically connected to the top source electrode portions 124, for example, through vias 155 disposed in the dielectric layer 270. The drain metal layers 160 are disposed on the dielectric layer 270 and are electrically connected to the top drain electrode portions 134, for example, through vias 165 disposed in the dielectric layer 270. The source metal layers 150 and the drain metal layers 160 extend along the second direction D2 and alternately arranged along the first direction D1. That is, the source metal layers 150 and the top source electrode portions 124 extend along different directions, and the drain metal layers 160 and the top drain electrode portions 134 extend along different directions. The source metal layers 150 are spaced from each other, and the drain metal layers 160 are spaced from each other.

The top source electrode portions 124 are electrically connected to the bottom source electrode portions 122, for example, through vias 126 disposed in the dielectric layer 260 and are electrically isolated from the gate electrodes 140. The top drain electrode portions 134 are electrically connected to the bottom drain electrode portions 132, for example, through vias 136 disposed in the dielectric layer 260. The top source electrode portions 124 are spaced from each other, and the top drain electrode portions 134 are spaced from each other.

Reference is made to FIG. 1. An orthogonal projection of the source pad 170 on the active layer 110 forms a source pad region 170R, and an orthogonal projection of the drain pad 180 on the active layer 110 forms a drain pad region 180R. An orthogonal projection of the source metal layer 150 on the active layer 110 forms a source metal layer region 150R, and an orthogonal projection of the drain metal layer 160 on the active layer 110 forms a drain metal layer region 160R. A total area of the overlapping region OV1 between the source pad region 170R and the drain metal layer region 160R is smaller than or equal to 40% of an area of the drain metal layer region 160R. A total area of the overlapping region OV2 between the drain pad region 180R and the source metal layer region 150R is smaller than or equal to 40% of an area of the source metal layer region 150R.

In the present embodiments, the source metal layer 150 and the drain metal layer 160 extending along the second direction D2 can distribute the electric current flows from the drain electrodes 130 and the source electrode 120 that extend along the first direction D1. The source pad 170 and the drain pad 180 can respectively collect the current form the source metal layer 150 and the drain metal layer 160. Therefore, the current uniformity can be improved.

Figure 4:
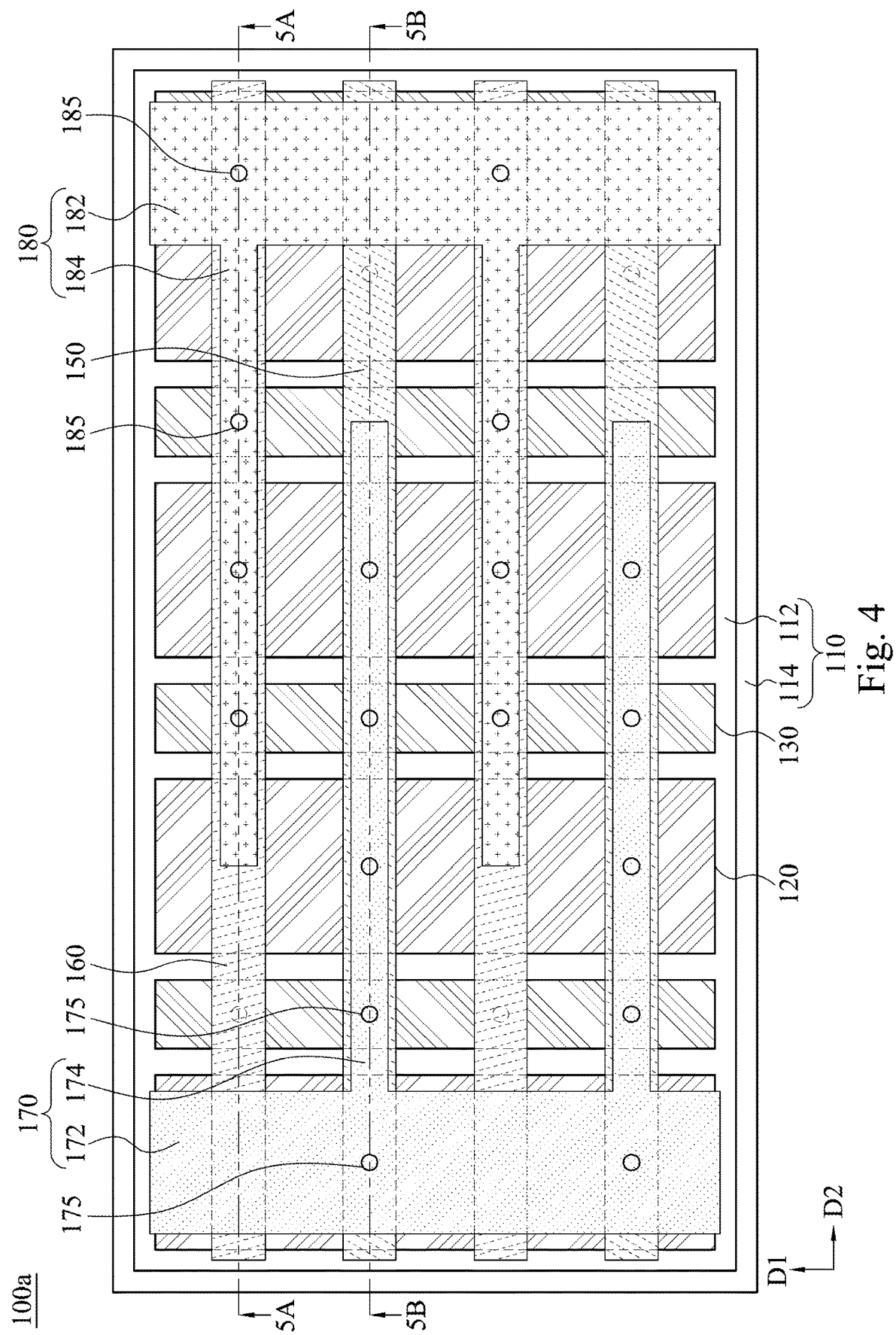
FIG. 4 is a top view of another semiconductor device according to some embodiments of the present disclosure.
Figure 5A:
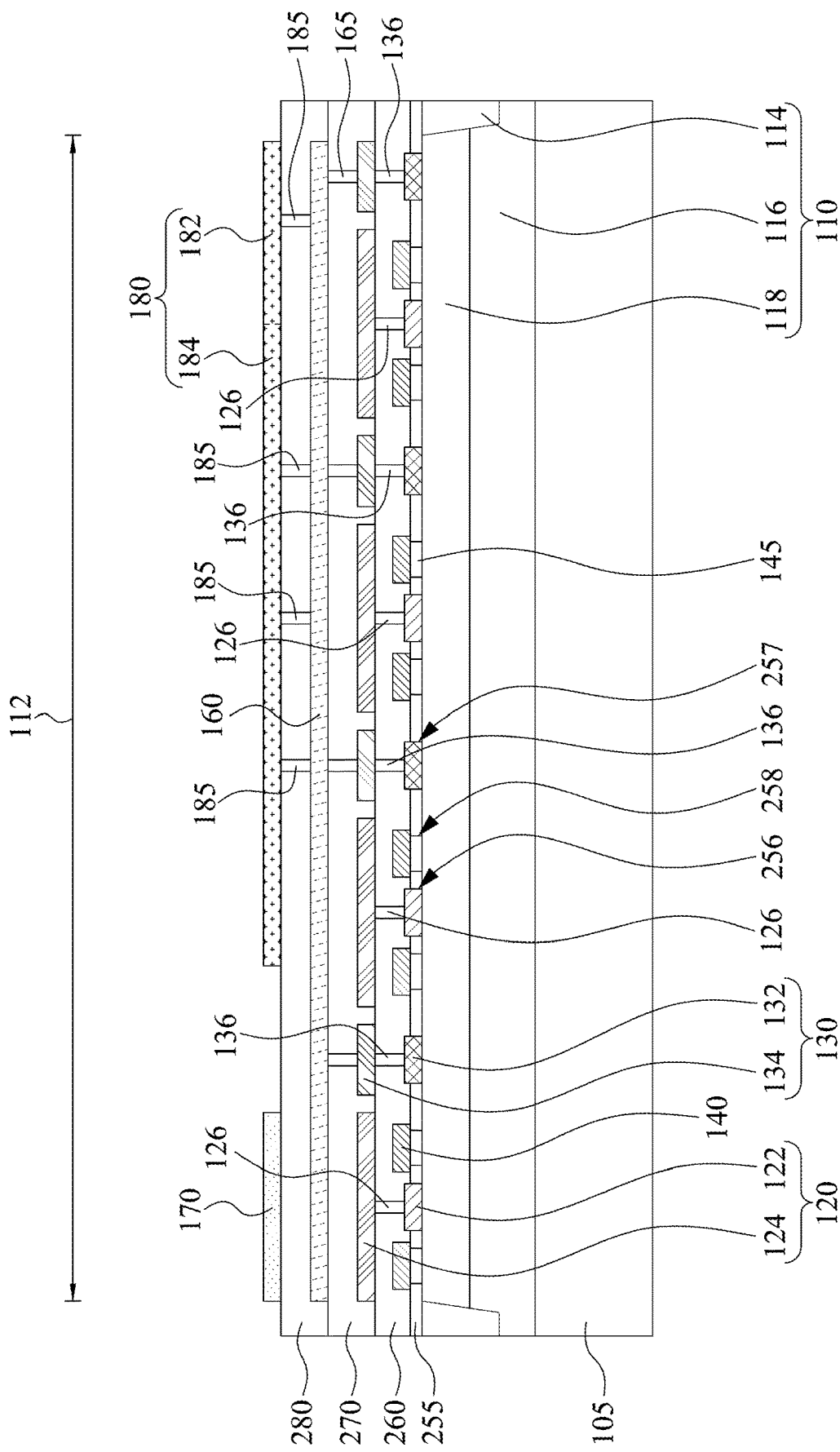
FIG. 5A is a cross-sectional view along line 5A-5A of FIG. 4.
Figure 5B:
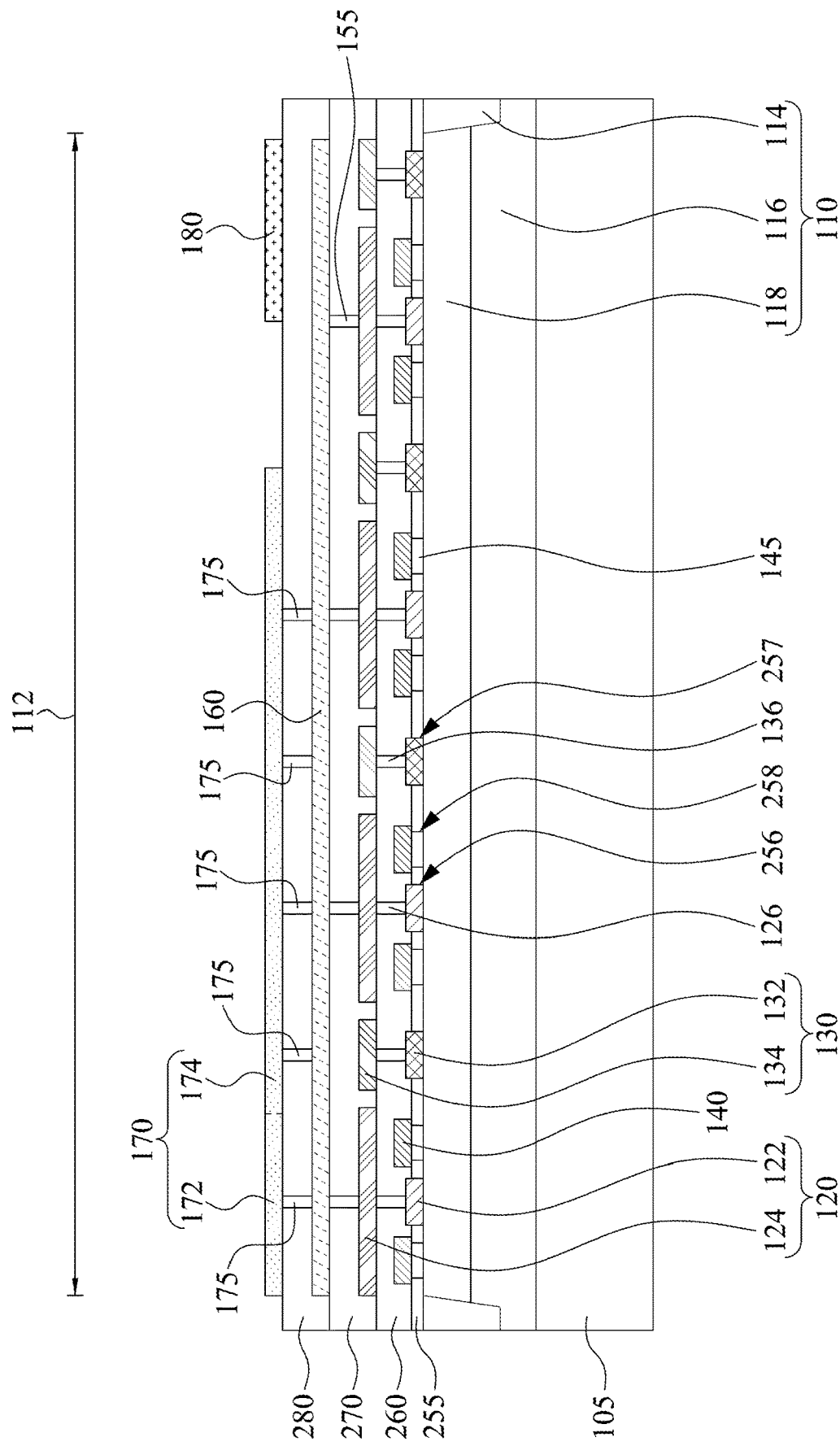
FIG. 5B is a cross-sectional view along line 5B-5B of FIG. 4.

FIG. 4 is a top view of another semiconductor device 100a according to some embodiments of the present disclosure, FIG. 5A is a cross-sectional view along line 5A-5A of FIG. 4, and FIG. 5B is a cross-sectional view along line 5B-5B of FIG. 4. Reference is made to FIGS. 4, 5A, and 5B. The difference between the semiconductor device 100a and the semiconductor device 100 of FIG. 1 is the configuration of the source pads 170 and the drain pads 180. In FIG. 4, the source pad 170 includes a body portion 172 and a plurality of first branch portion 174. The drain pad 180 includes a body portion 182 and a plurality of first branch portions 184. The body portion 172 of the source pad 170 extends along the first direction D1, and the first branch portions 174 of the source pad 170 extend along the second direction D2. The body portion 182 of the drain pad 180 extends along the first direction D1, and the first branch portions 184 of the drain pad 180 extend along the second direction D2. The first branch portions 174 of the source pads 170 and the first branch portions 184 of the drain pads 180 are alternately arranged along the first direction D1. Other relevant structural details of the semiconductor device of FIG. 4 are similar to the semiconductor device of FIG. 1, and, therefore, a description in this regard will not be repeated hereinafter.

The first branch portions 174 of the source pad 170 are parallel with the source metal layers 150, and first branch portions 174 of the source pad 170 are electrically connected with source metal layers 150 through vias 175. Therefore, the total thickness of metal layers (e.g., source metal layers 150 and source pad 170) that electrically connected to the source electrodes 120 is increased. With such configuration, the resistance of source along the second direction D2 can be reduced, and the current uniformity can be improved. Similarly, the first branch portions 184 of the drain pad 180 are parallel with the drain metal layers 160, and first branch portions 184 of the drain pad 180 are electrically connected with drain metal layers 160 through vias 185. Therefore, the total thickness of metal layers (e.g., drain metal layers 160 and drain pad 180) that are electrically connected to the drain electrodes 130 is increased. With such configuration, the resistance of drain along the second direction D2 can be reduced, and the current uniformity can be improved.

Furthermore, as illustrated in FIG. 4, an orthogonal projection of the first branch portions 174 of the source pad 170 are only overlapped with an orthogonal projection of the source metal layers 150, but are not overlapped with an orthogonal projection of the drain metal layers 160. Similarly, an orthogonal projection of the first branch portions 184 of the drain pad 180 are only overlapped with an orthogonal projection of the drain metal layers 160, but are not overlapped with an orthogonal projection of the source metal layers 150. With such configuration, the capacitance between the first branch portions 174 of the source pad 170 and the source metal layer 150 won't be increased, and the capacitance between the first branch portions 184 of the drain pad 180 and the drain metal layer 160 won't be increased.

Figure 6:
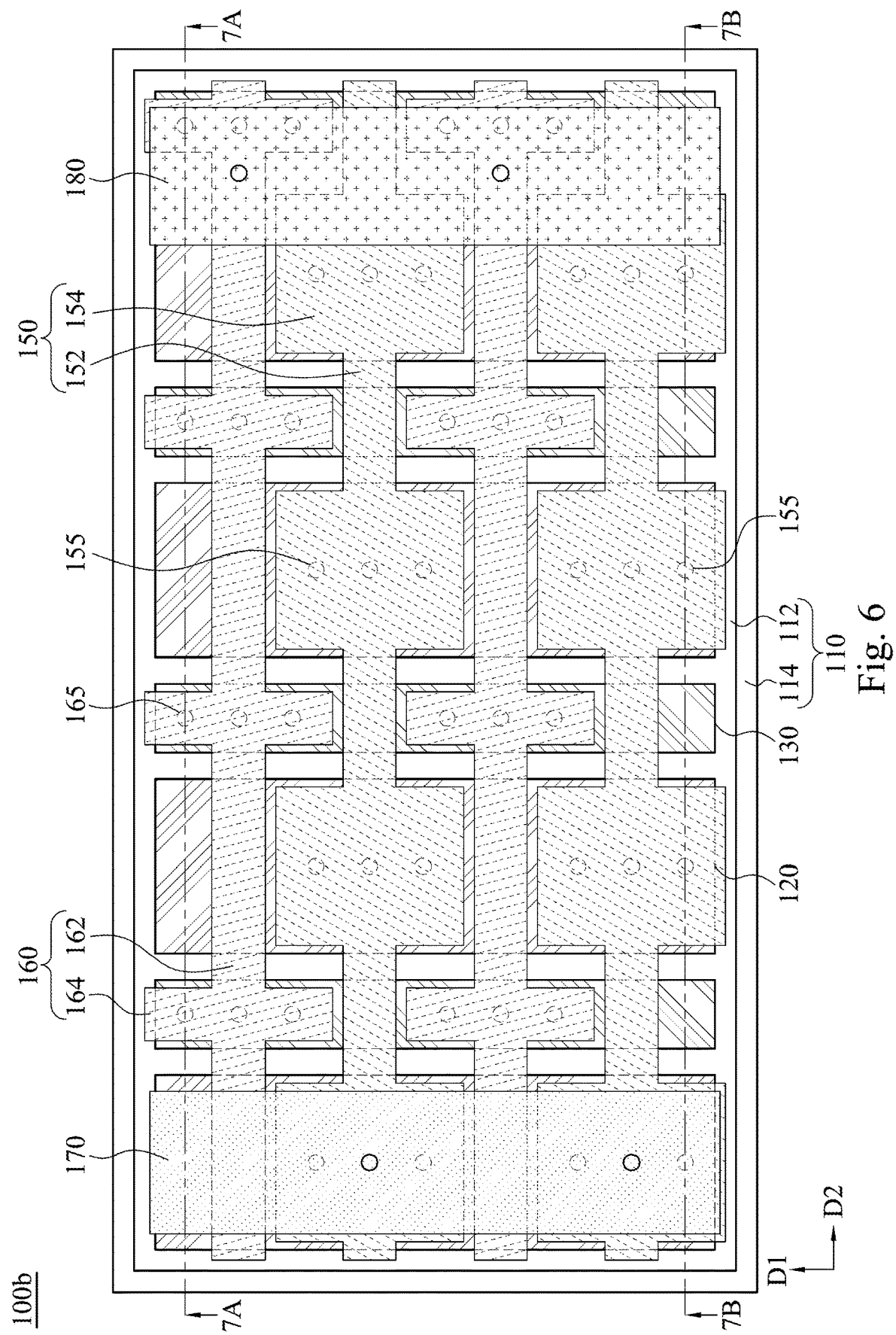
FIG. 6 is a top view of another semiconductor device according to some embodiments of the present disclosure.
Figure 7A:
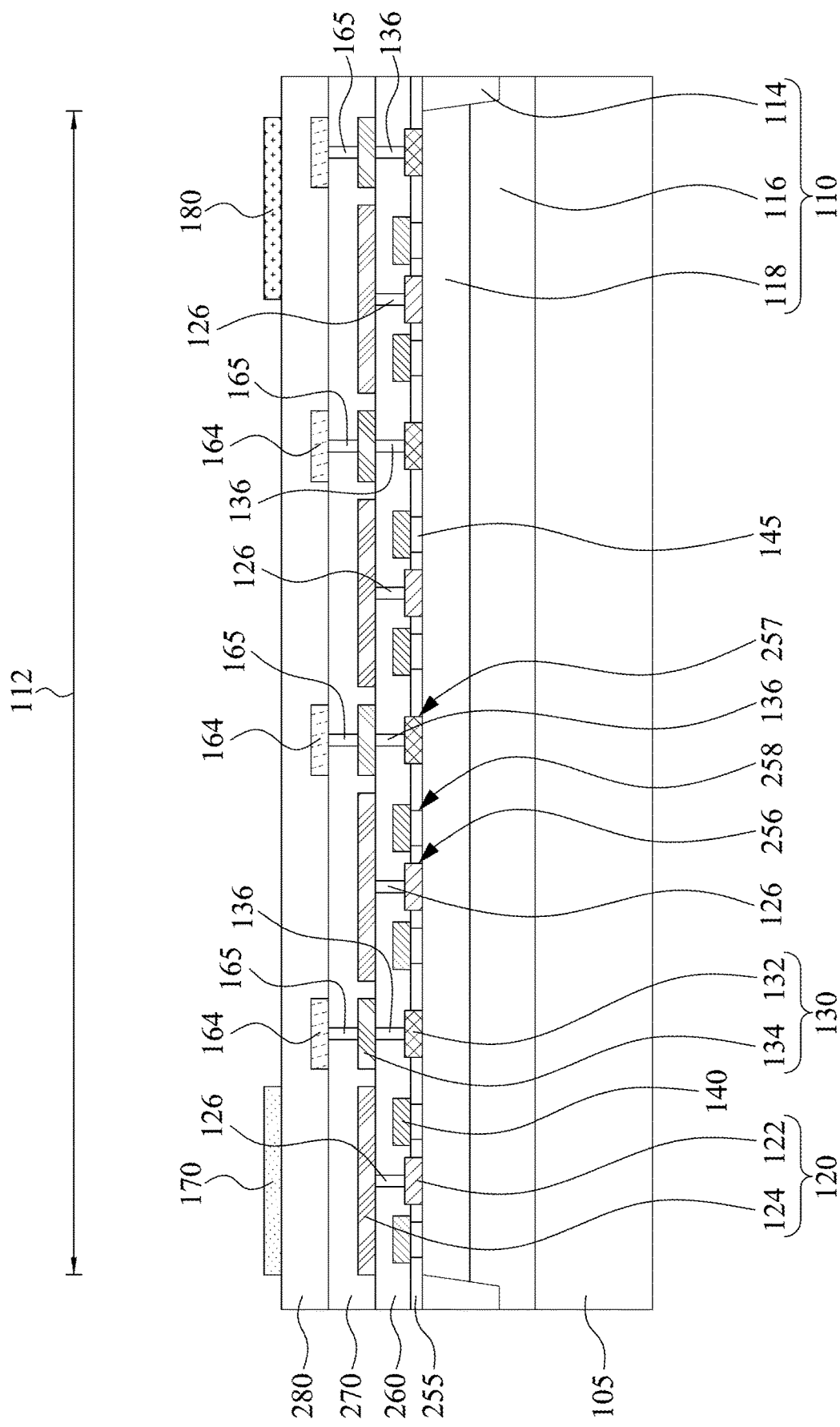
FIG. 7A is a cross-sectional view along line 7A-7A of FIG. 6.
Figure 7B:
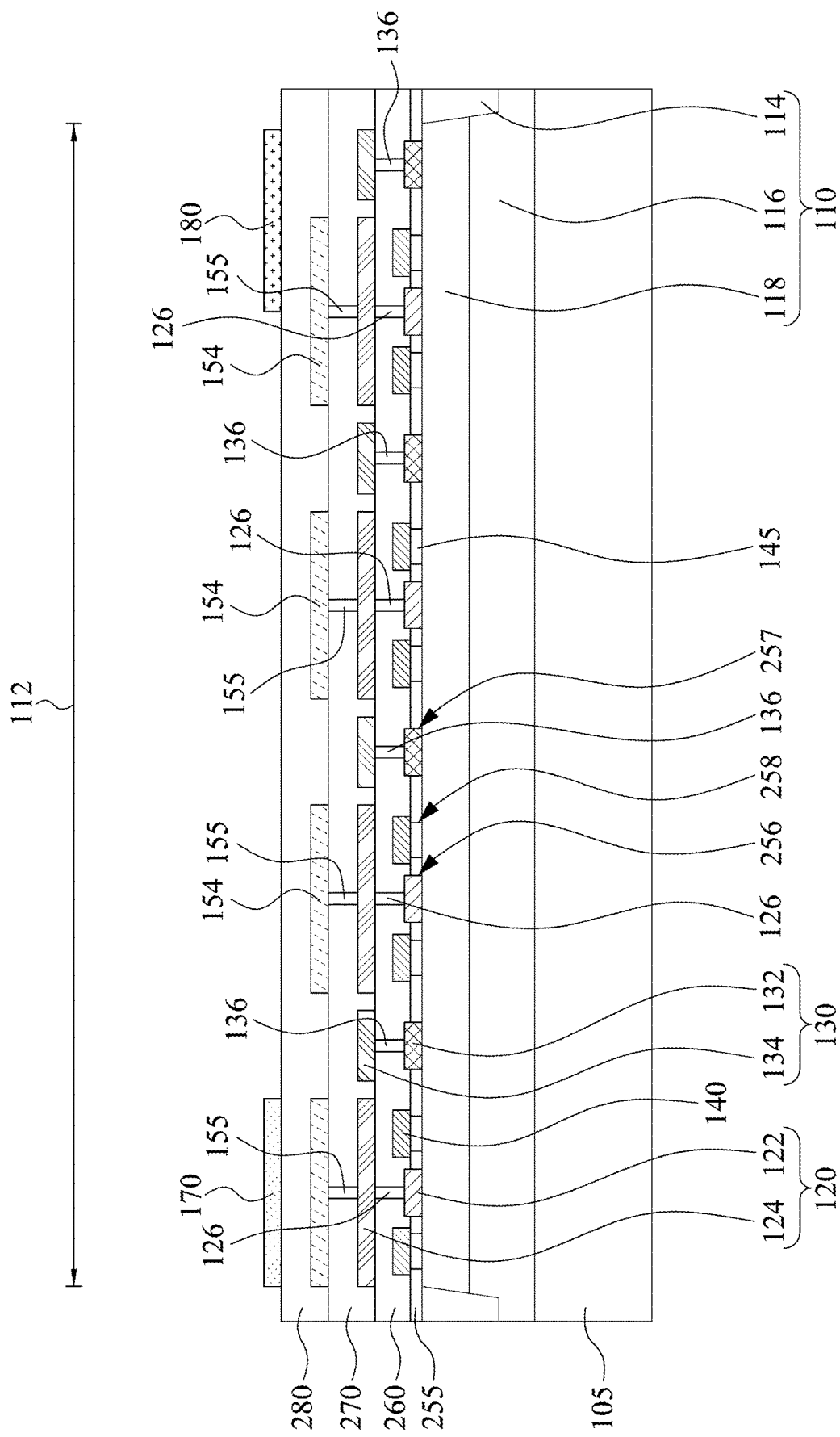
FIG. 7B is a cross-sectional view along line 7B-7B of FIG. 6.

FIG. 6 is a top view of another semiconductor device 100b according to some embodiments of the present disclosure, FIG. 7A is a cross-sectional view along line 7A-7A of FIG. 6, and FIG. 7B is a cross-sectional view along line 7B-7B of FIG. 6. Reference is made to FIGS. 6, 7A, and 7B. The difference between the semiconductor device 100b and the semiconductor device 100 of FIG. 1 is the configuration of the source metal layers 150 and the drain metal layers 160. In FIG. 6, the source metal layers 150 include first branch portion 152 and second branch portions 154. The drain metal layers 160 include first branch portions 162 and second branch portions 164. The first branch portion 152 of the source metal layers 150 extend along the second direction D2, and the second branch portions 154 of the source metal layers 150 extend along the first direction D1. The first branch portions 162 of the drain metal layers 160 extend along the second direction D2, and the second branch portions 164 of the drain metal layers 160 extend along the first direction D1. The second branch portions 154 of the source metal layers 150 and the second branch portions 164 of the drain metal layers 160 are alternately arranged along the second direction D2. Other relevant structural details of the semiconductor device of FIG. 6 are similar to the semiconductor device 100 of FIG. 1, and, therefore, a description in this regard will not be repeated hereinafter.

The length of the first branch portions 152 of the source metal layers 150 is related to the resistance of the source. In some embodiments, the resistance of the source is increased when the lengths of the first branch portions 152 of the source metal layers 150 are increased. As such, the second branch portions 154 of the source metal layers 150 can reduce the resistance of the source along the first direction D1, and the current uniformity can be improved. Similarly, the length of the first branch portions 162 of the drain metal layers 160 is related to the resistance of the source. In some embodiments, the resistance of the source is increased when the lengths of the first branch portions 162 of the drain metal layers 160 are increased. As such, the second branch portions 164 of the drain metal layers 160 can reduce the resistance of the drain along the first direction D1, and the current uniformity can be improved.

Figure 8:
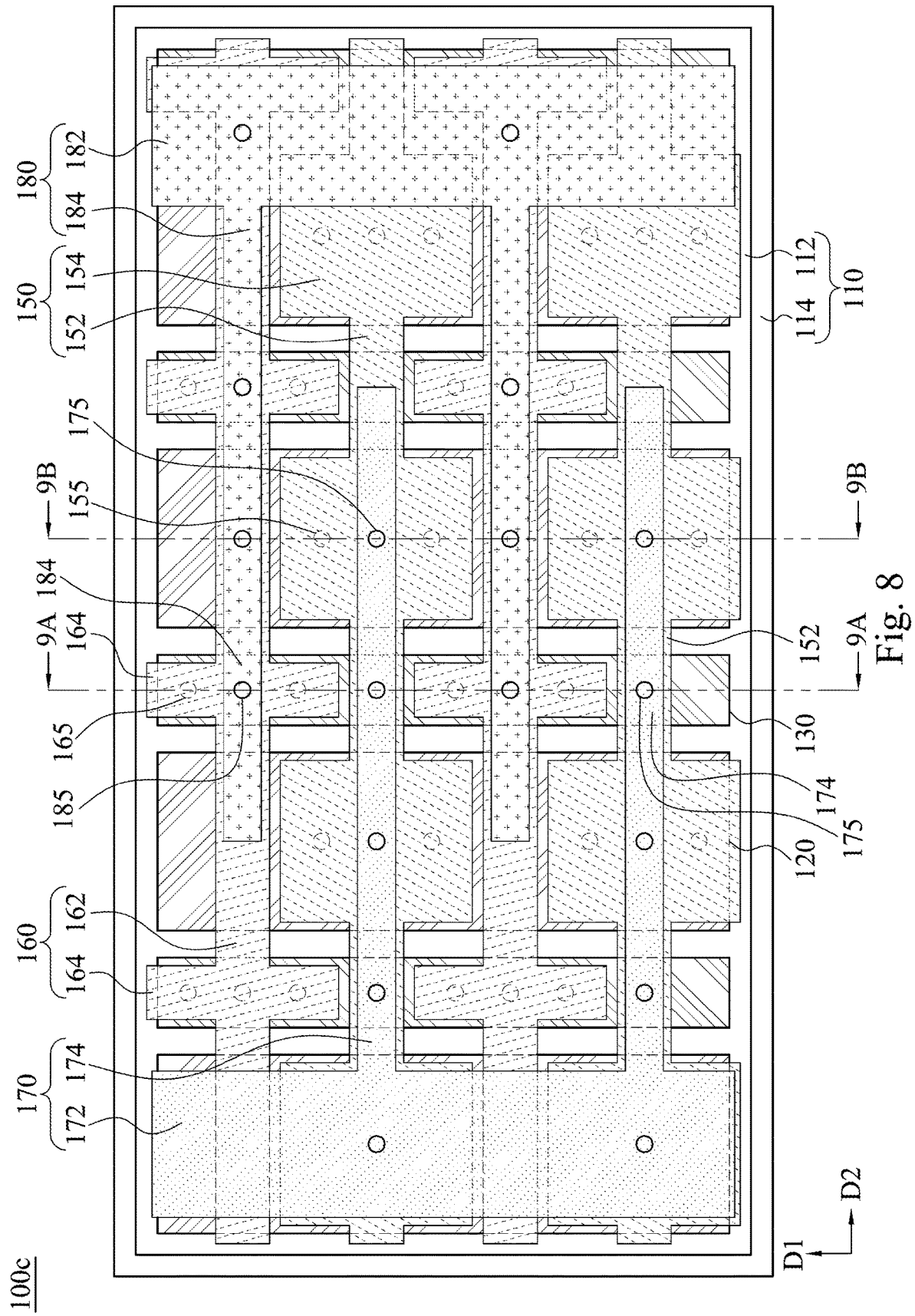
FIG. 8 is a top view of another semiconductor device according to some embodiments of the present disclosure.
Figure 9A:
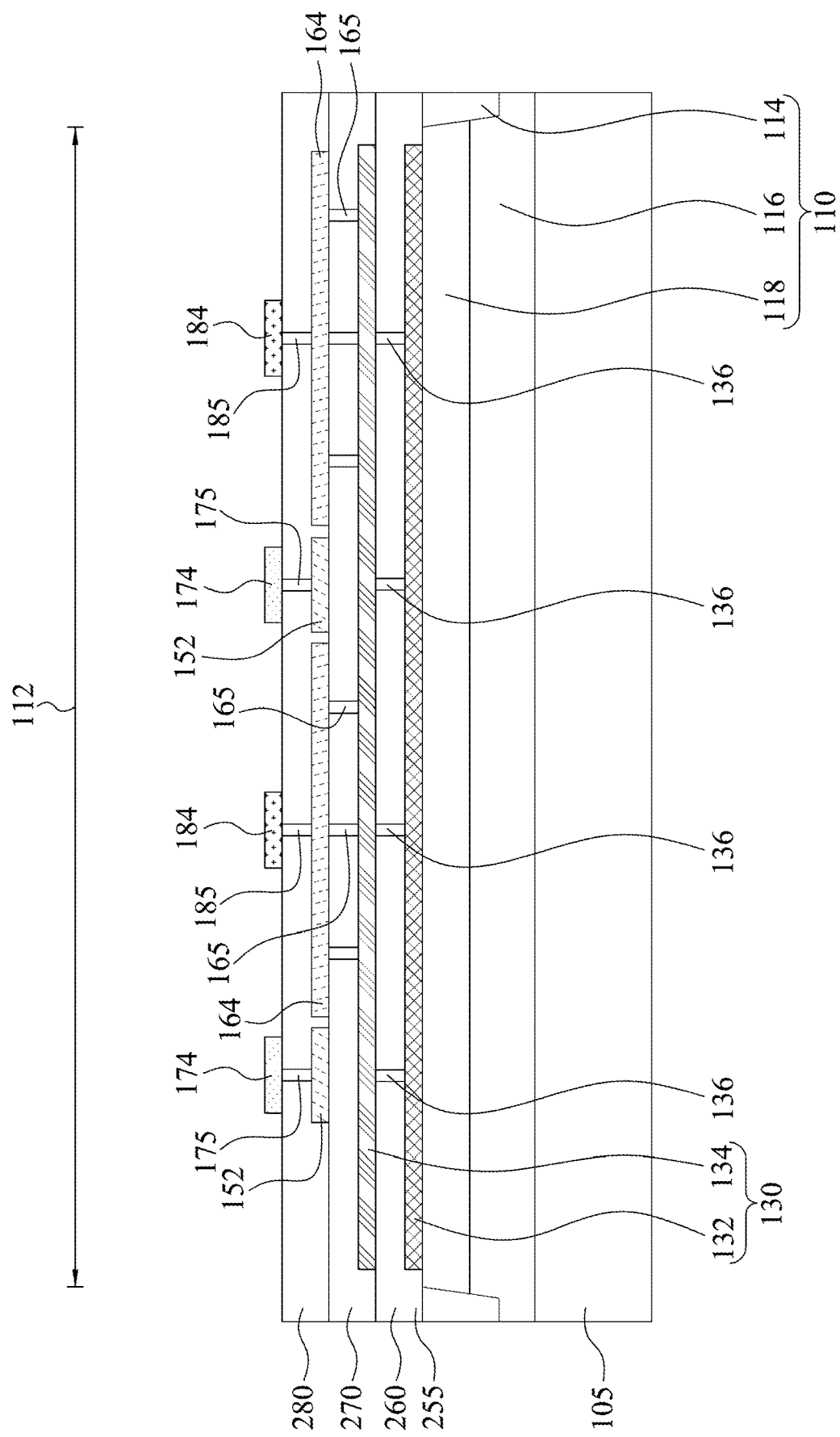
FIG. 9A is a cross-sectional view along line 9A-9A of FIG. 8.
Figure 9B:
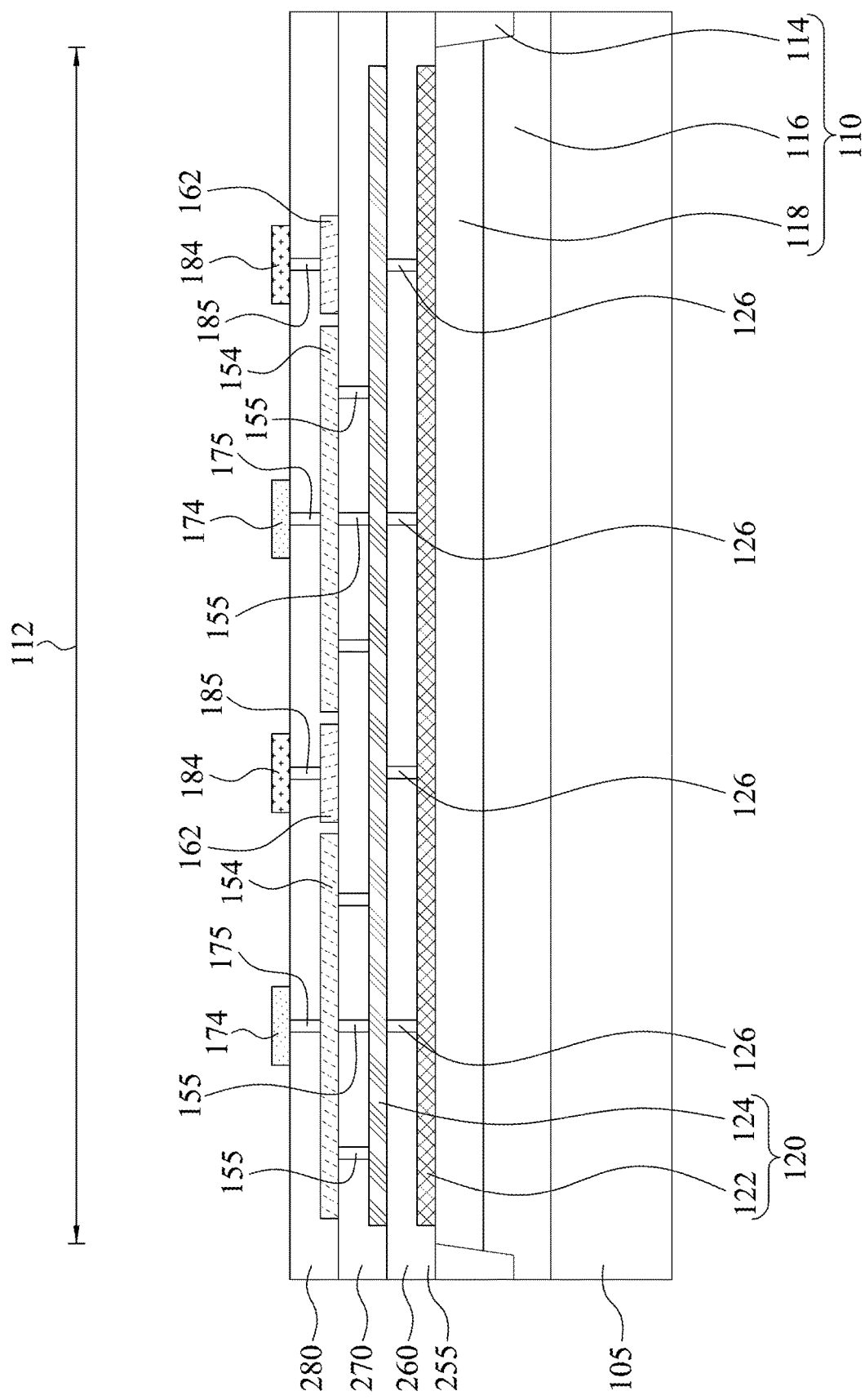
FIG. 9B is a cross-sectional view along line 9B-9B of FIG. 8.

FIG. 8 is a top view of another semiconductor device 100c according to some embodiments of the present disclosure, FIG. 9A is a cross-sectional view along line 9A-9A of FIG. 8 and FIG. 9B is a cross-sectional view along line 9B-9B of FIG. 8. Reference is made to FIGS. 8, 9A, and 9B. The difference between the semiconductor device 100c of FIG. 8 and the semiconductor device 100b of FIG. 6 is the configuration of the source pad 170 and the drain pad 180. In FIG. 8, the configuration of the source pad 170 and the drain pad 180 are the same as the semiconductor devices of FIG. 4. Other relevant structural details of the semiconductor device of FIG. 8 are similar to the semiconductor device 100b of FIG. 6, and, therefore, a description in this regard will not be repeated hereinafter. With such configuration, the resistance along the first direction D1 and the second direction D2 can both be reduced, and the current uniformity can be improved.

Figure 10:
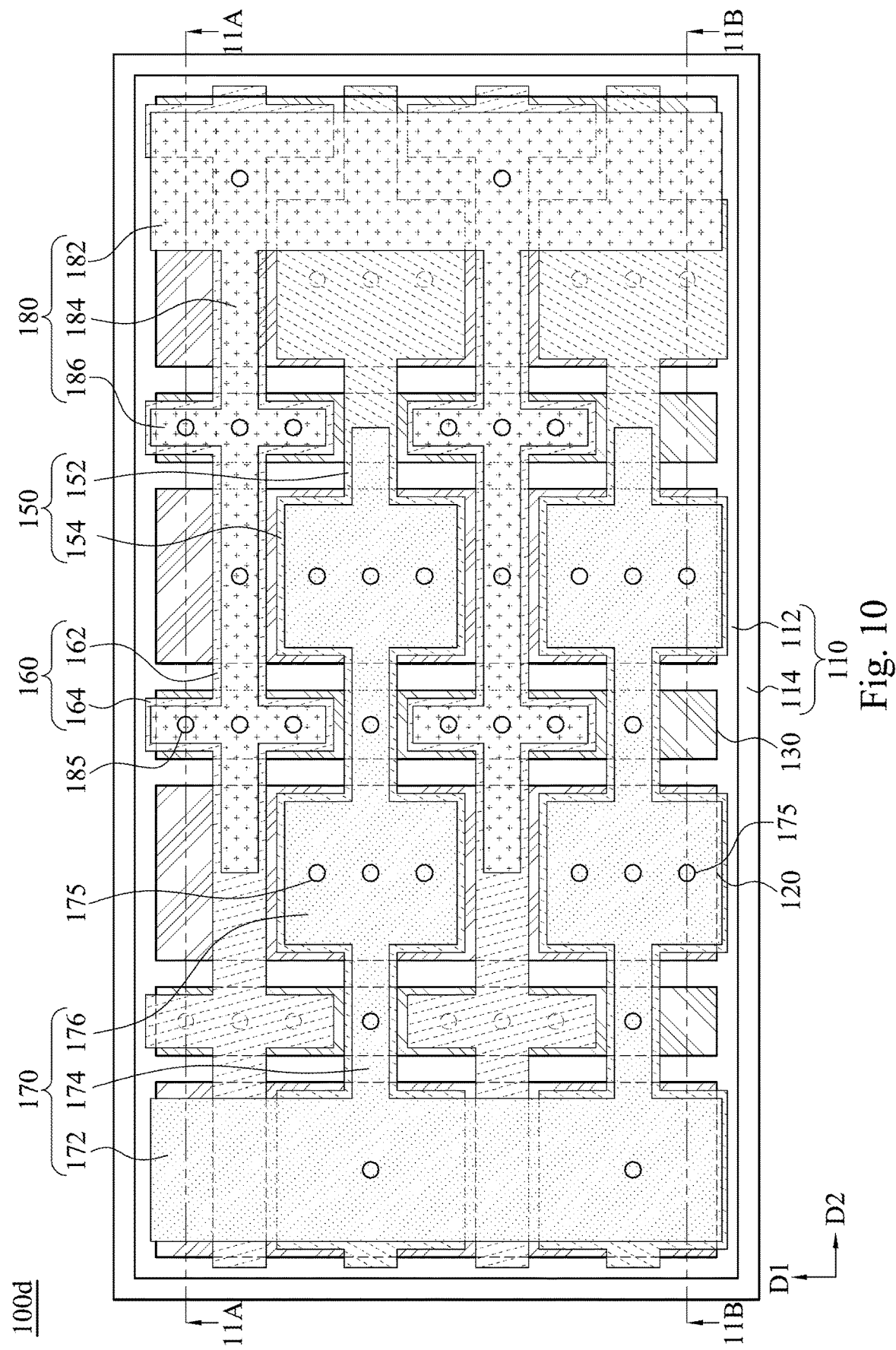
FIG. 10 is a top view of another semiconductor device according to some embodiments of the present disclosure.
Figure 11A:
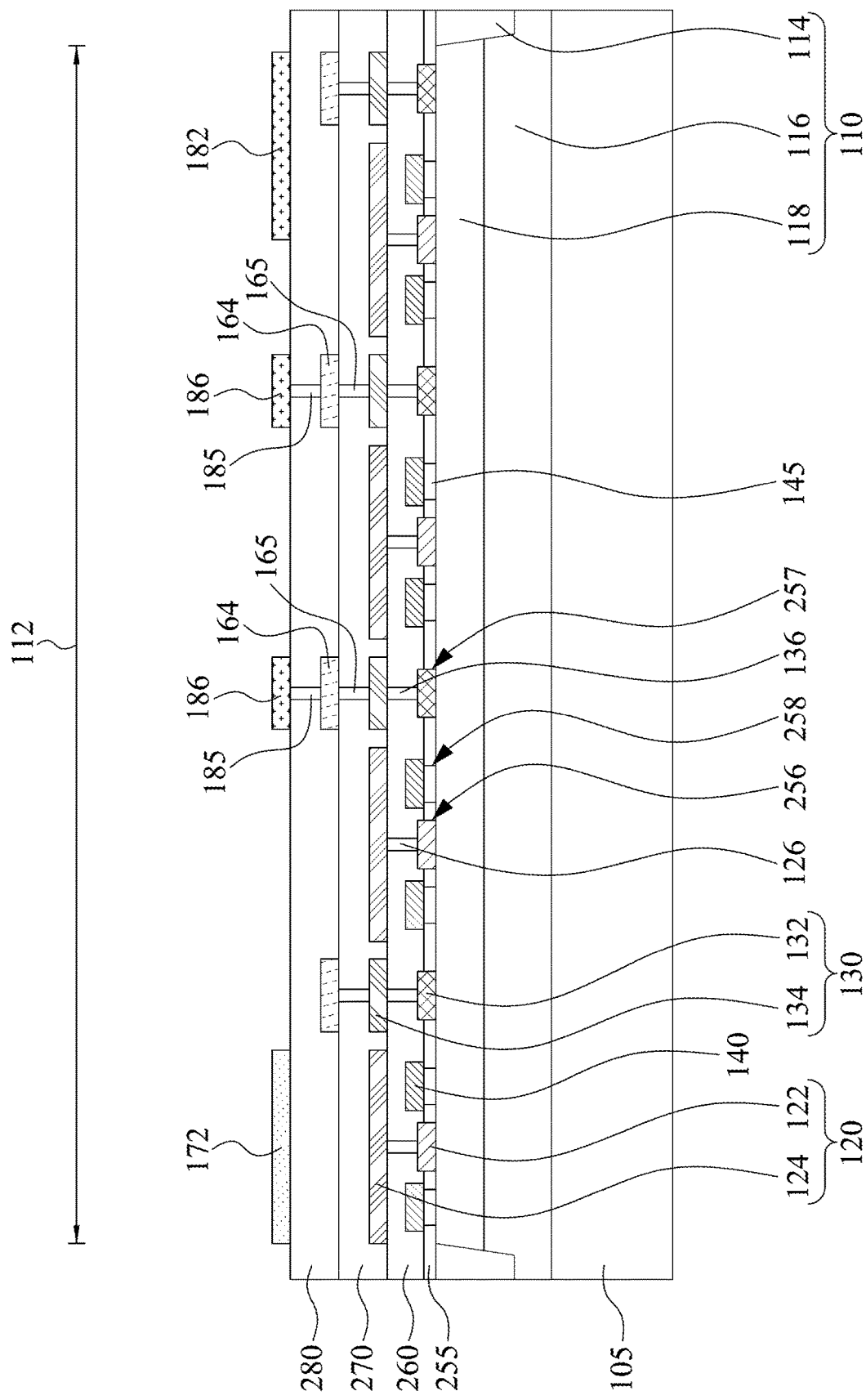
FIG. 11A is a cross-sectional view along line 11A-11A of FIG. 10.
Figure 11B:
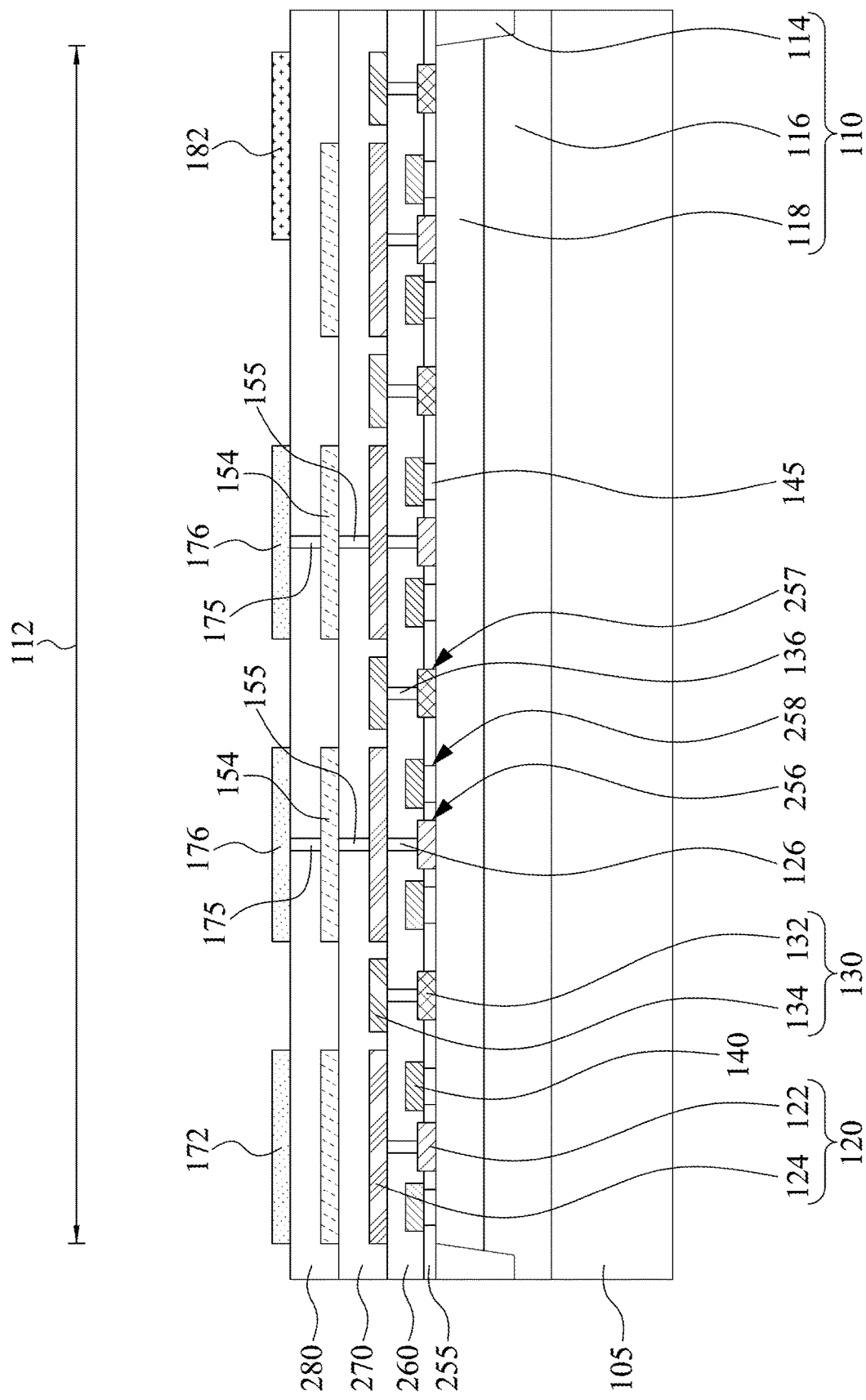
FIG. 11B is a cross-sectional view along line 11B-11B of FIG. 10.

FIG. 10 is a top view of another semiconductor device 100d according to some embodiments of the present disclosure, FIG. 11A is a cross-sectional view along line 11-11A of FIG. 10 and FIG. 11B is a cross-sectional view along line 11B-11B of FIG. 10. Reference is made to FIGS. 10, 11A, and 11B. The difference between the semiconductor device 100d of FIG. 10 and the semiconductor device 100c of FIG. 8 is the configuration of the source pad 170 and the drain pad 180. In FIG. 10, the source pad 170 further includes a plurality of second branch portion 176. The drain pad 180 further includes a plurality of second branch portion 186. The second branch portion 176 of the source pad 170 and the second branch portion 186 of the drain pad 180 extend along the first direction D1 and are alternately arranged along the second direction D2. Other relevant structural details of the semiconductor device 100d of FIG. 10 are similar to the semiconductor device 100c of FIG. 8, and, therefore, a description in this regard will not be repeated hereinafter.

The second branch portion 176 of the source pad 170 are parallel with the second branch portion 154 of the source metal layers 150, and second branch portion 176 of the source pad 170 are electrically connected with second branch portion 154 of source metal layers 150 through vias 175. Therefore, the total thickness of metal layers that electrically connected to the source electrodes 120 is increased. With such configuration, the resistance of source along the first direction D1 can be reduced, and the current uniformity can be improved. Similarly, the second branch portion 186 of the drain pad 180 are parallel with the second branch portion 164 of the drain metal layers 160, and second branch portion 186 of the drain pad 180 are electrically connected with the second branch portion 164 of the drain metal layers 160 through vias 185. Therefore, the total thickness of metal layers that are electrically connected to the drain electrodes 130 is increased. With such configuration, the resistance of drain along the first direction D1 can be reduced, and the current uniformity can be improved.

Furthermore, as illustrated in FIG. 10, an orthogonal projection of the second branch portions 176 of the source pad 170 are only overlapped with an orthogonal projection of the second branch portions 154 of the source metal layers 150, but are not overlapped with an orthogonal projection of the drain metal layers 160. Similarly, an orthogonal projection of the second branch portions 186 of the drain pad 180 are only overlapped with an orthogonal projection of the second branch portions 164 of the drain metal layers 160, but are not overlapped with an orthogonal projection of the source metal layers 150. With such configuration, the capacitance won't be increased.

Figure 12:
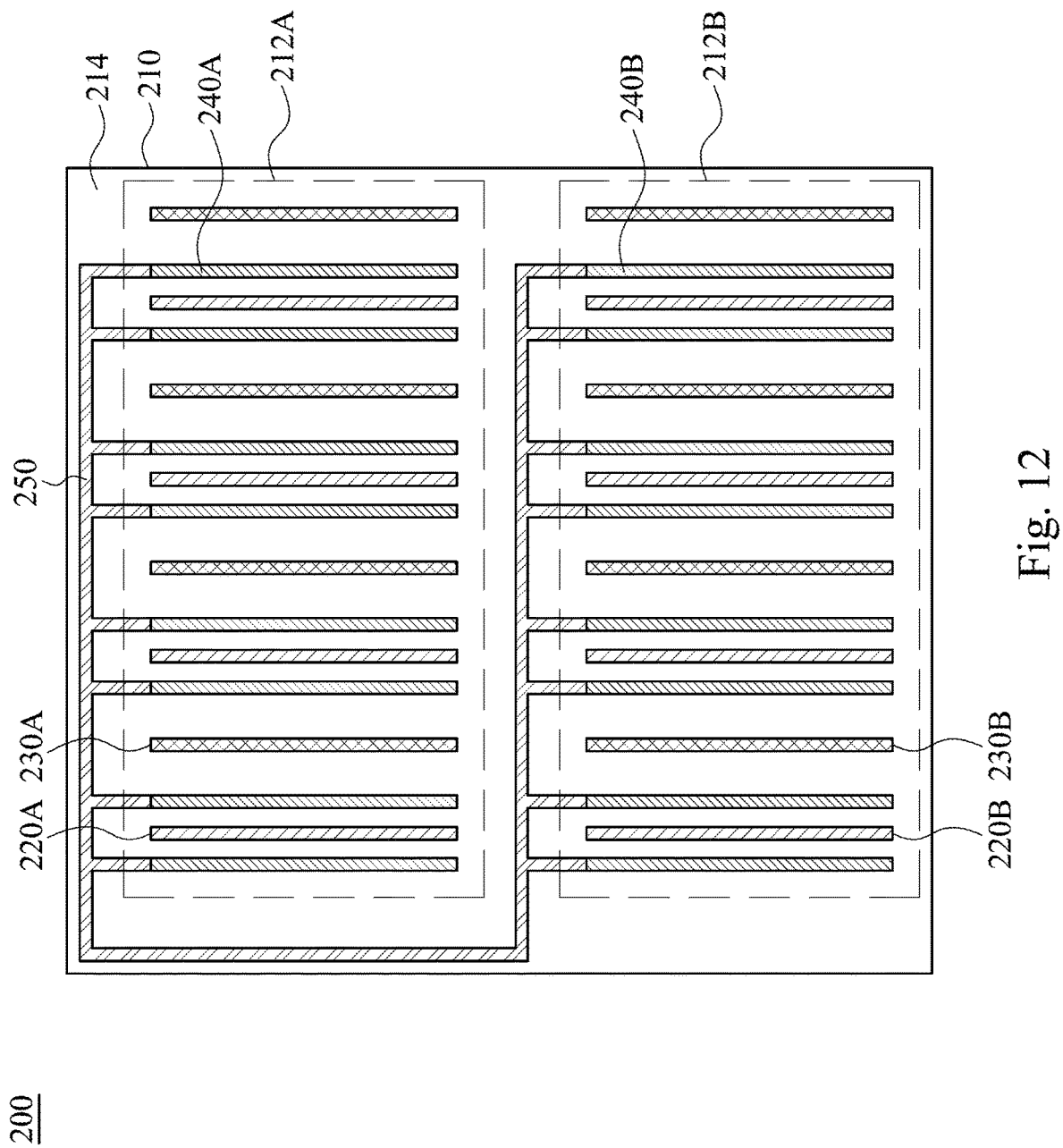
FIG. 12 is a top view of another semiconductor device according to some embodiments of the present disclosure.

FIG. 12 is a top view of another semiconductor device 200 according to some embodiments of the present disclosure. The semiconductor device 200 includes an active layer 210, a first active region 212A, a second active region 212B, first source electrodes 220A, second source electrodes 220B, first drain electrodes 230A, second drain electrodes 230B, first gate electrodes 240A, and second gate electrodes 240B. The first source electrodes 220A, the first drain electrodes 230A, and the first gate electrodes 240A are disposed in the first active region 212A. The second source electrodes 220B, the second drain electrodes 230B, and the second gate electrodes 240B are disposed in the second active region 212B. The active layer 210 further includes an insulating region 214 surrounding the first active region 212A and the second active region 212B. In some embodiments, the insulating region 214 is a shallow trench isolation (STI). The semiconductor device 200 further includes a gate bus 250 electrically connected with the first gate electrodes 240A and the second gate electrodes 240B. The gate bus 250, the first gate electrode 240A, and the second gate electrode 240B may be integrally formed as a gate electrode. In some other embodiments, the gate bus 250 may be gate metal, another metal layer, or combinations thereof. With such configuration, the semiconductor device 200 can form a parallel circuit.

In the present embodiment, the first source electrodes 220A and the second source electrodes 220B can be electrically connected to source metal layers and source pad as illustrated in FIGS. 1, 4, 6, 8, and 10. Similarly, the first drain electrode 230A and the second drain electrodes 230B can be electrically connected to drain metal layer and the drain pad as illustrated in FIGS. 1, 4, 6, 8, and 10, but the present embodiment is not limited in this regard. For example, in the present embodiment, a source metal layer or a drain metal layer may be disposed on and across a plurality of active regions. A source pad or a drain pad may be disposed on and across those active regions and are electrically connected to the source metal layer and the drain metal layer, respectively.

In some other embodiment, the number of active regions that are connected through the gate bus 250 can be more than two. Therefore, during the manufacturing process, a plurality of active regions including source electrodes, drain electrodes, and gate electrodes can be formed first. The electric connection between those gate electrodes in different active regions through gate bus can then be determined depend on the application requirement.

Figure 13:
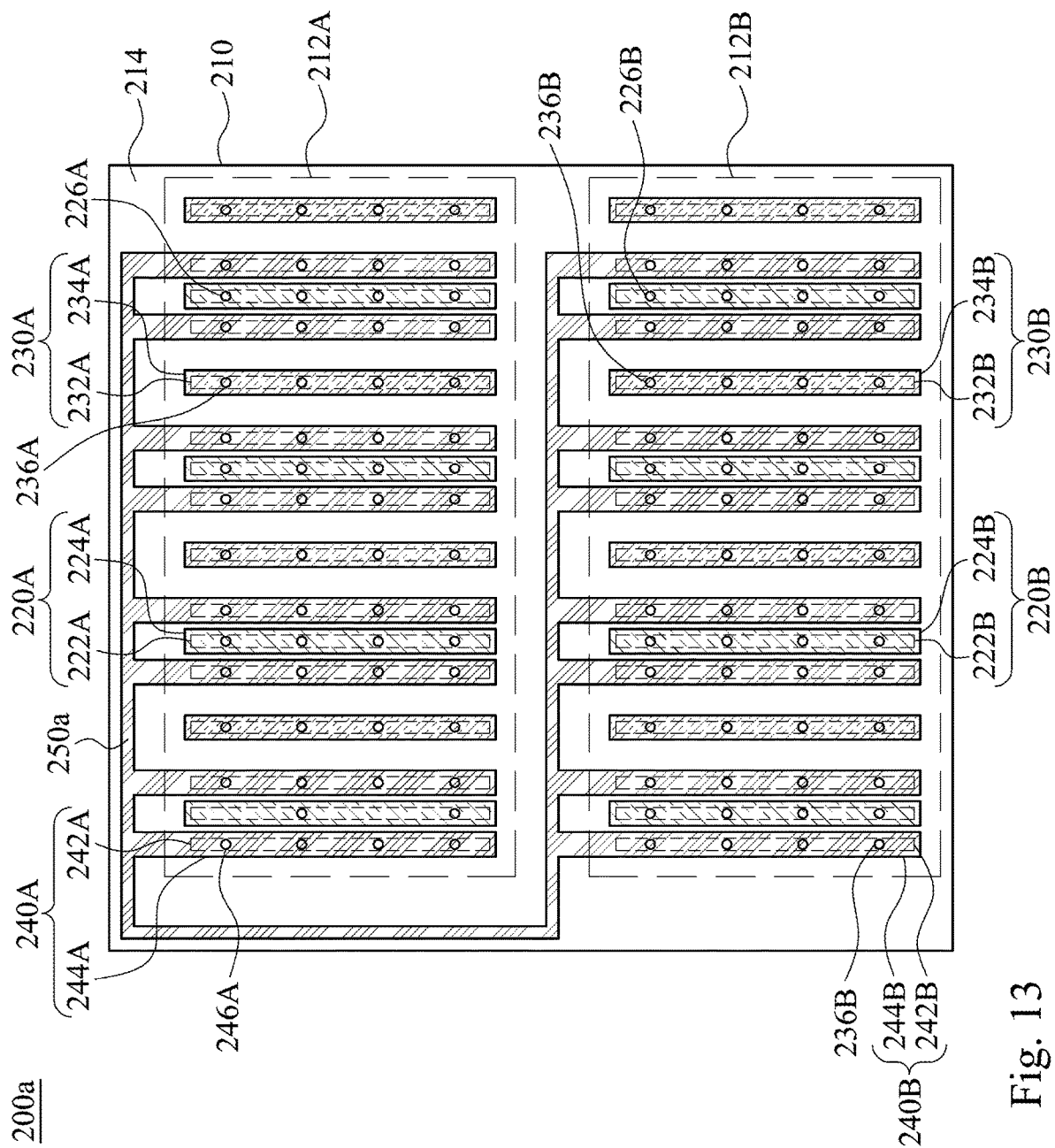
FIG. 13 is a top view of another semiconductor device according to some embodiments of the present disclosure.

FIG. 13 is a top view of another semiconductor device 200a according to some embodiments of the present disclosure. The first gate electrodes 240A include bottom electrode portions 242A and top electrode portions 244A. The second gate electrodes 240B include bottom electrode portions 242B and top electrode portions 244B. The top electrode portions 244A, 244B are electrically connected to the bottom electrode portions 242A, 242B through vias 246A, 246B, respectively. The top electrode portions 244A of the first gate electrodes 240A and the top electrode portions 244B of the second gate electrodes 240B are electrically connected through a gate bus 250a. That is, the gate bus 250a is laterally extends from the top electrode portions 244A of the first gate electrodes 240A and the top electrode portions 244B of the second gate electrodes 240B.

Similarly, the first source electrodes 220A include bottom electrode portions 222A and top electrode portions 224A. The second source electrodes 220B include bottom electrode portions 222B and top electrode portions 224B. The top electrode portions 224A, 224B are electrically connected to the bottom electrode portions 222A, 222B through vias 226A, 226B, respectively. The first drain electrodes 230A include bottom electrode portions 232A and top electrode portions 234A. The second drain electrodes 230B include bottom electrode portions 232A and top electrode portions 234B. The top electrode portions 234A, 234B are electrically connected to the bottom electrode portions 232A, 232B through vias 236A, 236B, respectively.

In the present embodiment, the top electrode portions 224A of the first source electrodes 220A and the top electrode portions 224B of second source electrodes 220B can be electrically connected to source metal layers and source pad as illustrated in FIGS. 1, 4, 6, 8, and 10. Similarly, the top electrode portions 234A of first drain electrode 230A and the top electrode portions 234B of second drain electrodes 230B can be electrically connected to drain metal layer and the drain pad as illustrated in FIGS. 1, 4, 6, 8, and 10, but the present embodiment is not limited in this regard.

Figure 14:
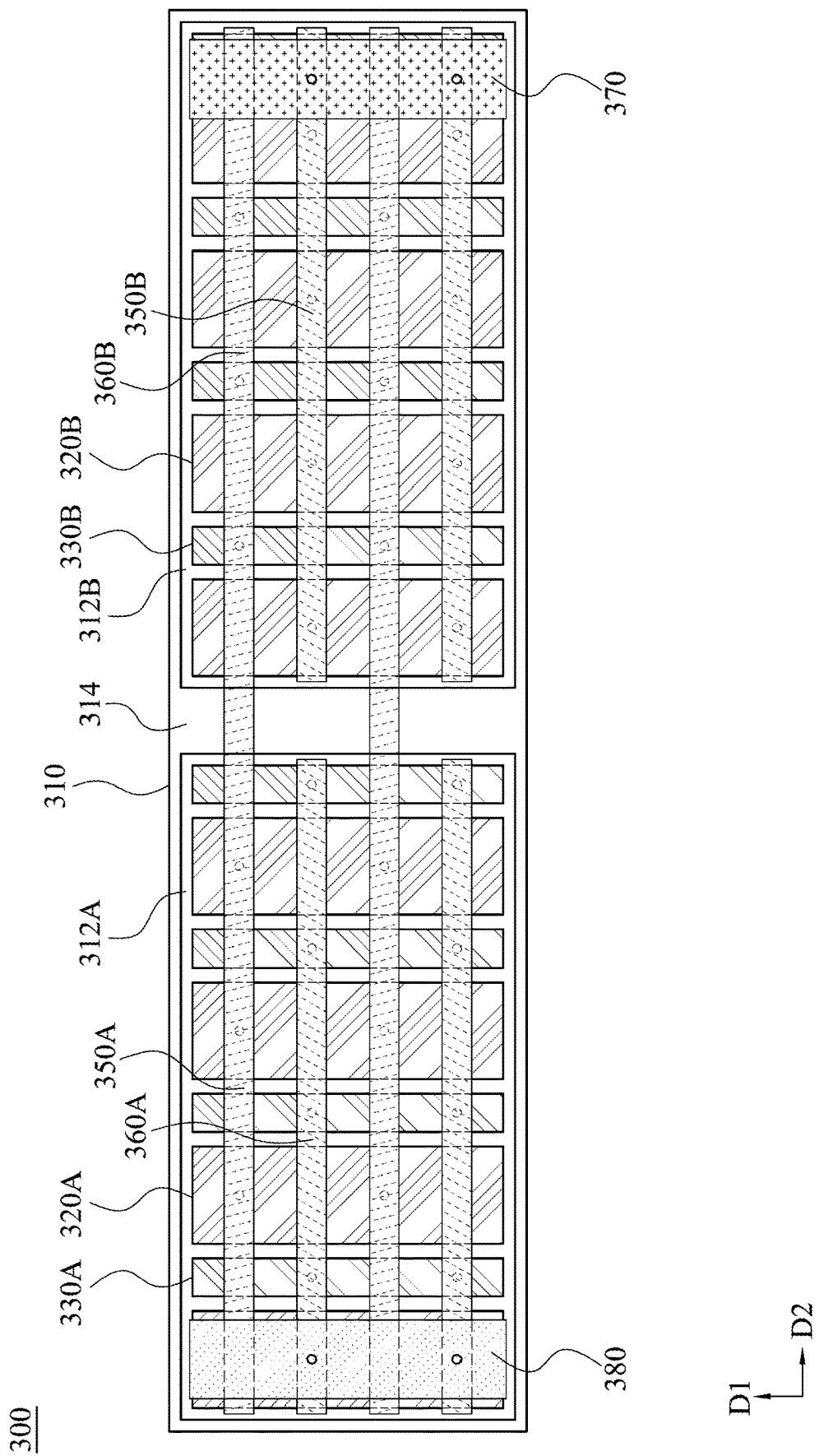
FIG. 14 is a top view of another semiconductor device according to some embodiments of the present disclosure.
Figure 15:
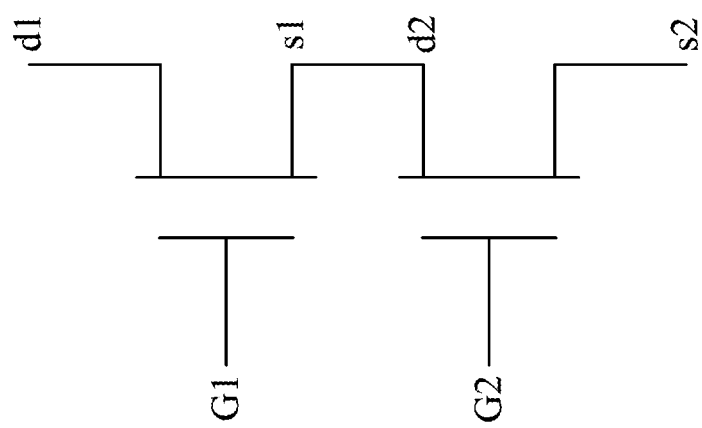
FIG. 15 is a circuit diagram of the semiconductor device in FIG. 14.

FIG. 14 is a top view of another semiconductor device 300 according to some embodiments of the present disclosure. FIG. 15 is a circuit diagram of the semiconductor device in FIG. 14. Reference is made to FIG. 14 and FIG. 15. The semiconductor device 300 includes an active layer 310, a first active region 312A, a second active region 312B, first source electrodes 320A, second source electrode 320B, first drain electrodes 330A, second drain electrode 330B, first source metal layers 350A, second source metal layers 350B, first drain metal layers 360A, second drain metal layers 360B, a source pad 370, and a drain pad 380. The first source electrodes 320A, the first drain electrodes 330A, the first source metal layers 350A, and the first drain metal layer 360A are disposed in the first active region 310A. The second source electrodes 320B, the second drain electrodes 330B, the second source metal layers 350B, and the second drain metal layer 360B are disposed in the second active region 310B. The active layer 310 further includes an insulating region 314 surrounding the first active region 312A and the second active region 312B. In some embodiments, the insulating region 314 is a shallow trench isolation (STI).

In the present embodiment, the first source metal layers 350A are electrically connected to the first source electrodes 320A, and the second source metal layers 350B are electrically connected to the second source electrodes 320B. The first drain metal layers 360A are electrically connected to the first drain electrodes 330A, and the second drain metal layers 360B are electrically connected to the second drain electrodes 330B and the first source metal layers 350A.

As illustrated in FIG. 15, a terminal s1 indicates the current flows from the first source electrodes 320A to the first source metal layers 350A, a terminal s2 indicates the current flows from the second source electrodes 320B to the second source metal layers 350B and the source pad 370, a terminal d1 indicates the current flows from the first drain electrodes 330A to the first drain metal layers 360A and the drain pad 380, and a terminal d2 indicates the current flows from the second drain electrodes 330B to the second drain metal layer 360B. The terminal s1 is electrically connected with the terminal d2. With such configuration, the semiconductor device 200 can form a series circuit.

Reference is made to FIG. 3, FIG. 14, and FIG. 15. In some embodiments, the semiconductor device 300 further includes first gate electrodes and second gate electrodes similarly to the gate electrodes 140 as illustrated in FIG. 3, but the present disclosure is not limited in this regard. A terminal G1 indicated the first gate electrodes disposed on the first active region 312A, and a terminal G2 indicated the second gate electrode disposed on the second active region 312B.

In some embodiments, the first source metal layers 350A and the second source metal layers 350B may include first portion and a plurality of second portions similarly to the embodiments illustrated in FIGS. 6, 8, and 10. In some embodiments, the first drain metal layers 360A and the second drain metal layers 360B may include first portion and a plurality of second portions similarly to the embodiments illustrated in FIGS. 6, 8, and 10. Furthermore, the source pad 370 and the drain pad 380 may include body portion and a plurality of first branch portions or second branch portions similarly to the embodiments illustrated in FIGS. 4, 8, and 10.

In some other embodiment, the number of active regions that are connected through the gate bus 250a can be more than two. Therefore, during the manufacturing process, a plurality of active regions including source electrodes, drain electrodes, and gate electrodes can be formed first. The electric connection between those source electrodes and the drain electrodes in different active regions can then be determined depend on the application requirement.

Although the present invention has been described in considerable detail with reference to certain embodiments thereof, other embodiments are possible.

Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention covers modifications and variations of this invention provided they fall within the scope of the following claims.

What is claimed is:

1. A semiconductor device, comprising:
   an active layer having an active region;
   a source electrode, a drain electrode, and a gate electrode disposed on the active region of the active layer and extending along a first direction;
   a source metal layer disposed on the active region and electrically connected to the source electrode;
   a drain metal layer disposed on the active region and electrically connected to the drain electrode, wherein the drain metal layer comprises a first branch portion extending along a second direction different from the first direction, and an orthogonal projection of the drain metal layer on the active layer forms a drain metal layer region; and
   a source pad disposed on the active region, wherein the source pad is electrically connected to the source metal layer, wherein the source pad comprises a body portion, the body portion has a longest continuously straight section extending along the second direction to form an equal width, and the equal width extends along the first direction to form the longest continuously straight section, and an orthogonal projection of the source pad on the active layer forms a source pad region that overlaps the drain metal layer region, and an area of an overlapping region between the source pad region and the drain metal layer region is smaller than or equal to 40% of an area of the drain metal layer region, and the entire overlapping region is located within an orthogonal projection of the body portion of the source pad on the active layer.

2. The semiconductor device of claim 1, wherein an orthogonal projection of the source metal layer on the active layer forms a source metal layer region, and the semiconductor device further comprises:
   a drain pad disposed on the active region, wherein the drain pad is electrically connected to the drain metal layer, an orthogonal projection of the drain pad on the active layer forms a drain pad region that overlaps the source metal layer region, and an area of an overlapping region between the drain pad region and the source metal layer region is smaller than or equal to 40% of an area of the source metal layer region.

3. The semiconductor device of claim 1, wherein the source electrode comprises a bottom electrode portion and a top electrode portion, wherein the bottom electrode portion of the source electrode is disposed between the top electrode portion of the source electrode and the active layer.

4. The semiconductor device of claim 1, wherein the drain electrode comprises a bottom electrode portion and a top electrode portion, wherein the bottom electrode portion of the drain electrode is disposed between the top electrode portion of the drain electrode and the active layer.

5. The semiconductor device of claim 1, wherein the source metal layer further comprises a second branch portion extending along the first direction.

6. The semiconductor device of claim 1, wherein the source pad comprises:
a first branch portion extending along the second direction different from the first direction.

7. The semiconductor device of claim 6, wherein the source metal layer comprises a first branch portion extending along the second direction and a second branch portion extending along the first direction.

8. The semiconductor device of claim 7, wherein the source pad further comprises a second branch portion extending along the first direction and electrically connected to the second branch portion of the source metal layer.

9. The semiconductor device of claim 1, wherein the drain metal layer further comprises a second branch portion extending along the first direction.

10. The semiconductor device of claim 1, wherein the drain pad comprises:
a body portion extending along the first direction; and
a first branch portion extending along the second direction different from the first direction.

11. The semiconductor device of claim 10, wherein the drain metal layer comprises a second branch portion extending along the first direction.

12. The semiconductor device of claim 11, wherein the drain pad further comprises a second branch portion extending along the first direction and electrically connected to the second branch portion of the drain metal layer.

13. The semiconductor device of claim 1, wherein the first direction is substantially perpendicular to the second direction.

* * * * *